(12) United States Patent
Kim

(10) Patent No.: US 11,233,509 B2
(45) Date of Patent: Jan. 25, 2022

(54) SEMICONDUCTOR SYSTEMS AND ELECTRONIC SYSTEMS

(71) Applicant: SK hynix Inc., Icheon-si (KR)

(72) Inventor: Kwang Soon Kim, Hanam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/011,302

(22) Filed: Sep. 3, 2020

(65) Prior Publication Data

US 2021/0367594 A1 Nov. 25, 2021

(30) Foreign Application Priority Data

May 19, 2020 (KP) .................. 10-2020-0060030

(51) Int. Cl.
| | | |
|---|---|---|
| *H03K 19/00* | (2006.01) | |
| *H03K 19/003* | (2006.01) | |
| *H03K 17/296* | (2006.01) | |
| *H03K 17/687* | (2006.01) | |
| *H03K 19/17784* | (2020.01) | |

(52) U.S. Cl.
CPC ....... *H03K 19/0005* (2013.01); *H03K 17/296* (2013.01); *H03K 17/6877* (2013.01); *H03K 19/00384* (2013.01); *H03K 19/17784* (2013.01)

(58) Field of Classification Search
None
See application file for complete search history.

(56) References Cited

U.S. PATENT DOCUMENTS

| | | | | |
|---|---|---|---|---|
| 10,347,325 | B1* | 7/2019 | Chou | G11C 11/4074 |
| 2011/0057721 | A1* | 3/2011 | Komyo | G11C 14/0009 |
| | | | | 327/551 |
| 2011/0242916 | A1* | 10/2011 | Seol | H04L 25/0278 |
| | | | | 365/198 |

FOREIGN PATENT DOCUMENTS

KR 1020130076584 A 7/2013

* cited by examiner

*Primary Examiner* — Jany Richardson
(74) *Attorney, Agent, or Firm* — William Park & Associates Ltd.

(57) ABSTRACT

An electronic system includes a reception device and a transmission device. The reception device generates reception data from transmission data input to a reception node and includes a termination circuit which is coupled to the reception node to perform an impedance matching operation. The transmission device generates a drive control signal from internal data based on a mode signal and drives the transmission data based on the drive control signal.

22 Claims, 16 Drawing Sheets

SEMICONDUCTOR SYSTEMS AND ELECTRONIC SYSTEMS

CROSS-REFERENCE TO RELATED APPLICATIONS

The present application claims priority under 35 U.S.C 119(a) to Korean Application No. 10-2020-0060030, filed on May 19, 2020, which is incorporated herein by reference in its entirety.

BACKGROUND

1. Technical Field

Embodiments of the present disclosure relate to semiconductor systems performing an impedance matching operation and electronic systems including the same.

2. Related Art

Electronic systems employing semiconductor systems may include various internal devices for transmitting and receiving signals and various internal circuits for performing various operations. As an operation speed of the electronic systems becomes faster, a possibility that an impedance mismatching phenomenon between the internal devices and the internal circuits occurs has increased.

When the semiconductor systems operate at a high speed, an impedance matching circuit realized using an on-die termination circuit or an on-chip termination circuit may be employed in the semiconductor systems to solve the impedance mismatching phenomenon between the internal devices and the internal circuits.

SUMMARY

According to an embodiment, an electronic system may include a reception device and a transmission device. The reception device may be configured to generate reception data from transmission data input to a reception node. The reception device may include a termination circuit which is coupled to the reception node to perform an impedance matching operation. The transmission device may be configured to generate a drive control signal from internal data based on a mode signal. The transmission device may be configured to drive the transmission data based on the drive control signal. The drive control signal may be inactivated regardless of the internal data based on the mode signal.

According to another embodiment, an electronic system may include a termination circuit, a drive control signal generation circuit, and a drive circuit. The termination circuit may be connected to a reception node to which transmission data are input. The termination circuit may be configured to perform an impedance matching operation to drive the reception node. The drive control signal generation circuit may be configured to generate a first drive control signal and a second drive control signal from internal data based on a mode signal. The drive circuit may be configured to drive the transmission data based on the first drive control signal and the second drive control signal. The first drive control signal or the second drive control signal may be inactivated regardless of the internal data when the mode signal is activated.

According to yet another embodiment, a semiconductor system may include a controller and a memory device. The controller may be configured to output a command, configured to receive transmission data through a reception node, and designed to include a termination circuit which is connected to the reception node to perform an impedance matching operation. The memory device may be configured to perform a read operation based on the command to output the transmission data, configured to generate a drive control signal from internal data based on a mode signal, and configured to drive the transmission data based on the drive control signal. The drive control signal may be inactivated regardless of the internal data based on the mode signal.

DETAILED DESCRIPTION

In the description of the following embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter with reference to the accompanying drawings. However, the embodiments described herein are for illustrative purposes only and are not intended to limit the scope of the present disclosure.

Figure 1:
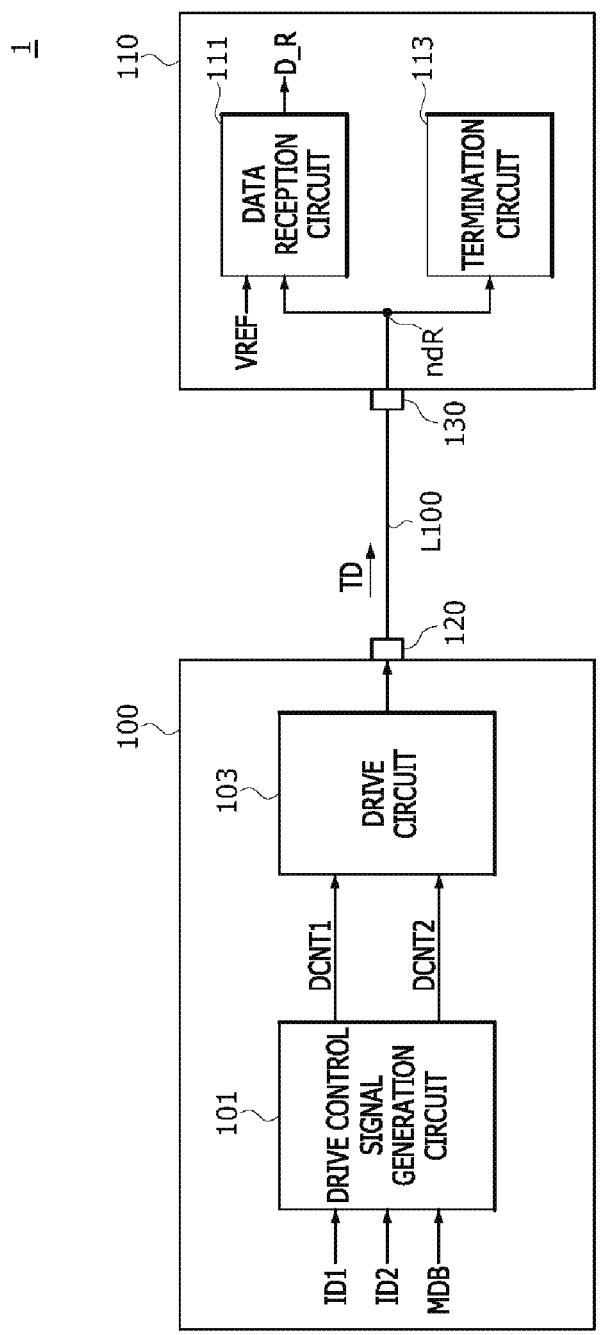
FIG. 1 is a block diagram illustrating a configuration of an electronic system according to an embodiment of the present disclosure.

FIG. 1 is a block diagram illustrating a configuration of an electronic system 1 according to an embodiment of the present disclosure. As illustrated in FIG. 1, the electronic system 1 may include a transmission device 100 and a reception device 110. The transmission device 100 and the reception device 110 may be electrically connected to each other through a transmission pin 120 and a reception pin 130. The transmission device 100 may output transmission data TD, which are driven according to an internal operation of the transmission device 100, through the transmission pin 120. The internal operation of the transmission device 100 may include various operations, for example, a test operation during which signals and data are output from the transmission device 100. The transmission data TD may be transmitted from the transmission pin 120 to the reception pin 130 through a transmission line L100. The reception device 110 may receive the transmission data TD through the reception pin 130. The reception device 110 may monitor a state of the transmission device 100 or may control the transmission device 100, based on the transmission data TD. The reception device 110 may include an impedance matching circuit, which is connected to a reception node ndR to which the transmission data TD are input, to drive the reception node ndR to a first logic level or a second logic level. In the present embodiments, the first logic level may be set as a logic "high" level, and the second logic level may be set as a logic "low" level. However, in some other embodiments, the first logic level may be set as a logic "low" level, and the second logic level may be set as a logic "high" level.

The transmission device 100 may include a drive control signal generation circuit 101 and a drive circuit 103.

The drive control signal generation circuit 101 may generate a first drive control signal DCNT1 and a second drive control signal DCNT2 based on a first internal data ID1, a second internal data ID2, and a mode signal MDB. The mode signal MDB may be activated to enter an operation mode for reducing power consumption while an impedance matching operation is performed. The mode signal MDB may be inactivated to out of the operation mode. The mode signal MDB may be applied from outside of the transmission device 100 or generated from outside of the transmission device 100. The first internal data ID1 and the second internal data ID2 may be set to have predetermined logic levels according to a logic level to which the transmission data TD are driven. The drive control signal generation circuit 101 may generate the first drive control signal DCNT1 which is activated by the first internal data ID1 when the transmission data TD are driven to the first logic level while the mode signal MDB is inactivated out of the operation mode. The drive control signal generation circuit 101 may generate the second drive control signal DCNT2 which is activated by the second internal data ID2 when the transmission data TD are driven to the second logic level while the operation mode is inactivated. The drive control signal generation circuit 101 may generate the first drive control signal DCNT1 which is activated by the first internal data ID1 when the transmission data TD are driven to the first logic level while the mode signal MDB is activated to enter the operation mode and the reception node ndR is driven to the second logic level. The drive control signal generation circuit 101 may generate the second drive control signal DCNT2 which is activated by the second internal data ID2 when the transmission data TD are driven to the second logic level while the reception node ndR is driven to the first logic level in the operation mode. The drive control signal generation circuit 101 may inactivate the second drive control signal DCNT2 regardless of the second internal data ID2 when the transmission data TD are driven to the second logic level while the reception node ndR is driven to the second logic level in the operation mode, thereby reducing current which is consumed to generate the second drive control signal DCNT2. The drive control signal generation circuit 101 may inactivate the first drive control signal DCNT1 regardless of the first internal data ID1 when the transmission data TD are driven to the first logic level while the reception node ndR is driven to the first logic level in the operation mode, thereby reducing current which is consumed to generate the first drive control signal DCNT1.

The drive circuit 103 may drive the transmission data TD based on the first drive control signal DCNT1 and the second drive control signal DCNT2. The drive circuit 103 may drive the transmission data TD to the first logic level when the first drive control signal DCNT1 is activated and the second drive control signal DCNT2 is inactivated while the operation mode is inactivated. The drive circuit 103 may drive the transmission data TD to the second logic level when the first drive control signal DCNT1 is inactivated and the second drive control signal DCNT2 is activated while the operation mode is inactivated. The drive circuit 103 may receive the first drive control signal DCNT1 which is activated and the second drive control signal DCNT2 which is inactivated, thereby driving the transmission data TD to the first logic level when the transmission data TD are driven to the first logic level while the reception node ndR is driven to the second logic level in the operation mode. The drive circuit 103 may receive the first drive control signal DCNT1 which is inactivated and the second drive control signal DCNT2 which is inactivated, thereby inhibiting the transmission data TD from being driven when the transmission data TD are driven to the second logic level while the reception node ndR is driven to the second logic level in the operation mode. As a result, it may be possible to reduce power consumption of the electronic system 1. The drive circuit 103 may receive the first drive control signal DCNT1 which is inactivated and the second drive control signal DCNT2 which is activated, thereby driving the transmission data TD to the second logic level when the transmission data TD are driven to the second logic level while the reception node ndR is driven to the first logic level in the operation mode. The drive circuit 103 may receive the first drive control signal DCNT1 which is inactivated and the second drive control signal DCNT2 which is inactivated, thereby inhibiting the transmission data TD from being driven when the transmission data TD are driven to the first logic level while the reception node ndR is driven to the first logic level in the operation mode. As a result, it may be possible to reduce power consumption of the electronic system 1.

The reception device 110 may include a data reception circuit 111 and a termination circuit 113.

The data reception circuit 111 may receive the transmission data TD, which is input to the reception pin 130, through the reception node ndR. The data reception circuit 111 may receive the transmission data TD to generate reception data D_R based on a reference voltage VREF. The data reception circuit 111 may buffer or amplify the transmission data TD using the reference voltage VREF as a reference logic level to output the buffered data or the amplified data as the reception data D_R. In the reception device 110, the reception data D_R may be used to monitor a state of the transmission device 100 and may also be used to control the transmission device 100.

The termination circuit 113 may be electrically connected to the reception node ndR through which the transmission data TD are input. The termination circuit 113 may be realized using an on-die termination circuit or an on-chip termination circuit to function as an impedance matching circuit. The termination circuit 113 may be designed to have an impedance value which is matched with an impedance value of the transmission line L100 through which the transmission data TD are transmitted. The termination circuit 113 may include a passive element or an active element that has an impedance value which is matched with an impedance value of the transmission line L100. The passive element may be realized using a resistor, and the active element may be realized using a MOS transistor which is turned on for impedance matching. The passive element or the active element may drive the reception node ndR to the first logic level or the second logic level according to the embodiments.

The electronic system 1 according to the present embodiments may provide the operation mode in which the first drive control signal DCNT1 or the second drive control signal DCNT2 is inactivated when the transmission data TD are driven by the termination circuit 113 included in the reception device 110, thereby reducing an amount of a current that is consumed to generate the first drive control signal DCNT1 and the second drive control signal DCNT2. In addition, the electronic system 1 according to the present embodiments may provide the operation mode in which some of operations of the drive circuit 103 are inhibited when the transmission data TD are driven by the termination circuit 113 included in the reception device 110, thereby reducing an amount of a current that is consumed to drive the transmission data TD.

Figure 2:
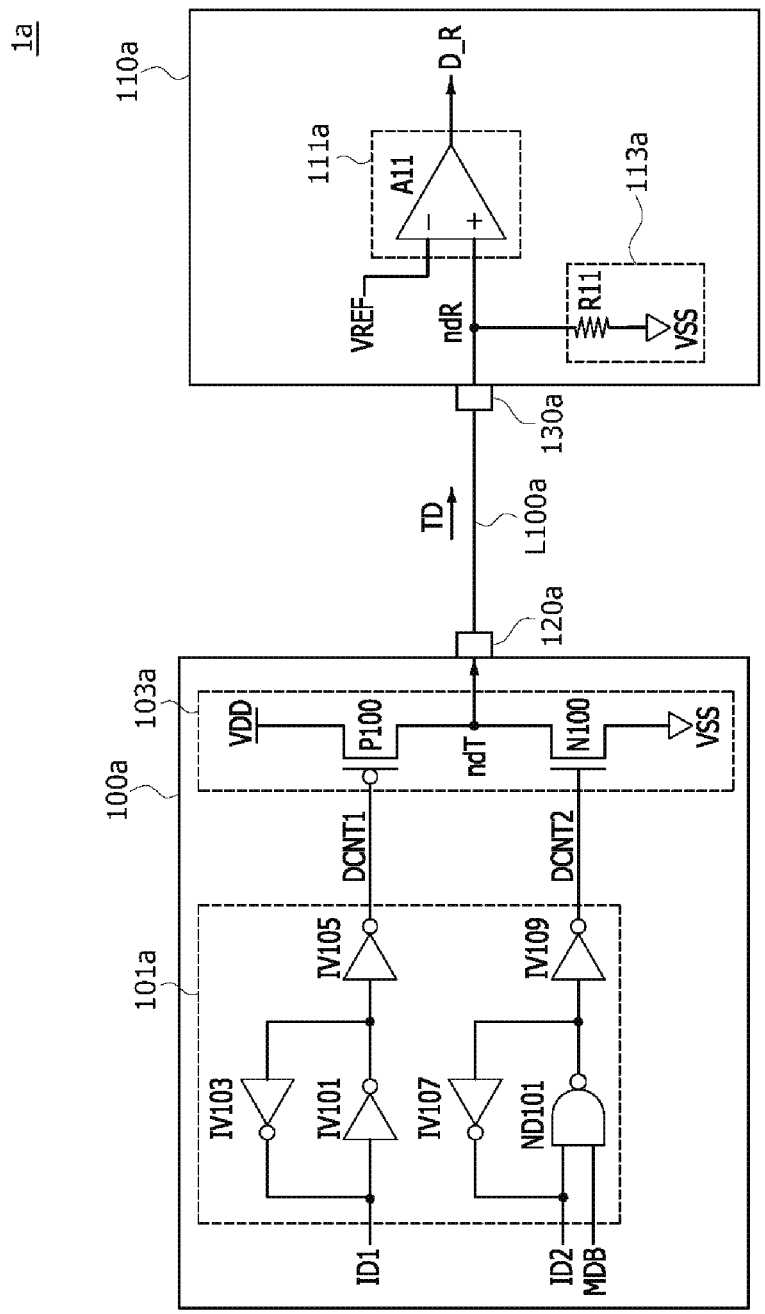
FIG. 2 is a circuit diagram illustrating an example of the electronic system illustrated in FIG. 1.

FIG. 2 is a circuit diagram of an electronic system 1a corresponding to an example of the electronic system 1 illustrated in FIG. 1. As illustrated in FIG. 2, the electronic system 1a may include a transmission device 100a and a reception device 110a. The transmission device 100a and the reception device 110a may be electrically connected to each other through a transmission pin 120a and a reception pin 130a. The transmission device 100a may output transmission data TD, which are driven according to an internal operation of the transmission device 100a, through the transmission pin 120a. The transmission data TD may be transmitted from the transmission pin 120a to the reception pin 130a through a transmission line L100a. The reception device 110a may receive the transmission data TD through the reception pin 130a. The reception device 110a may monitor a state of the transmission device 100a or may control the transmission device 100a, based on the transmission data TD. The reception device 110a may include an impedance matching circuit, which is connected to a reception node ndR to which the transmission data TD are input through the reception pin 130a, to drive the reception node ndR to a logic "low" level.

The transmission device 100a may include a drive control signal generation circuit 101a and a drive circuit 103a.

The drive control signal generation circuit 101a may include inverters IV101, IV103, IV105, IV107, and IV109 and NAND gates ND101 and may generate a first drive control signal DCNT1 and a second drive control signal DCNT2 based on a first internal data ID1, a second internal data ID2, and a mode signal MDB. In the present embodiments, both of the first internal data ID1 and the second internal data ID2 may be set to have a logic "low" level when the transmission data TD are driven to have a logic "high" level, and both of the first internal data ID1 and the second internal data ID2 may be set to have a logic "high" level when the transmission data TD are driven to have a logic "low" level. However, the present disclosure is not limited thereto. The drive control signal generation circuit 101a may latch the first internal data ID1 using the inverters IV101 and IV103 and may buffer the first internal data ID1 using the inverters IV101 and IV105 to output the buffered data of the first internal data ID1 as the first drive control signal DCNT1. While the mode signal MDB is inactivated to have a logic "high" level out of the operation mode, the drive control signal generation circuit 101a may latch the second internal data ID2 using the NAND gate ND101 and the inverter IV107 and may buffer the second internal data ID2 using the NAND gate ND101 and the inverter IV109 to output the buffered data of the second internal data ID2 as the second drive control signal DCNT2. While the mode signal MDB is activated to have a logic "low" level in the operation mode, the drive control signal generation circuit 101a may inactivate the second drive control signal DCNT2 to a logic "low" level regardless of the second internal data ID2. In the present embodiments, the first drive control signal DCNT1 may be set to be activated to a logic "low" level, and the second drive control signal DCNT2 may be set to be activated to a logic "high" level. However, the present disclosure is not limited thereto. When the transmission data TD are driven to a logic "low" level while the reception node ndR is driven to have a logic "low" level in the operation mode, the drive control signal generation circuit 101a may inactivate the second drive control signal DCNT2 to reduce an amount of a current which is consumed to generate the second drive control signal DCNT2.

The drive circuit 103a may include a PMOS transistor P100 and an NMOS transistor N100 to drive a transmission node ndT based on the first drive control signal DCNT1 and the second drive control signal DCNT2. Because a signal of the transmission node ndT is output through the transmission pin 120a, the transmission data TD may be regarded as being driven by drive circuit 103a. The PMOS transistor P100 may be coupled between a power supply voltage VDD terminal and the transmission node ndT and may be turned on when the first drive control signal DCNT1 is activated to have a logic "low" level to drive the transmission node ndT to a logic "high" level. The NMOS transistor N100 may be coupled between a ground voltage VSS terminal and the transmission node ndT and may be turned on when the second drive control signal DCNT2 is activated to have a logic "high" level to drive the transmission node ndT to a logic "low" level. The drive circuit 103a may drive the transmission node ndT to a logic "high" level using the PMOS transistor P100 which is turned on when the first drive control signal DCNT1 is activated to have a logic "low" level and may drive the transmission node ndT to a logic "low" level using the NMOS transistor N100 which is turned on when the second drive control signal DCNT2 is activated to have a logic "high" level while the operation mode is inactivated. The drive circuit 103a may drive the transmission node ndT to a logic "high" level using the PMOS transistor P100 which is turned on when the first drive control signal DCNT1 is activated to have a logic "low" level in the operation mode and may inhibit the transmission node ndT from being driven using the NMOS transistor N100 which is turned off by the second drive control signal DCNT2 which is inactivated to have a logic "low" level regardless of the second internal data ID2 in the operation mode. The drive circuit 103a may receive the second drive control signal DCNT2 inactivated to a logic "low" level in the operation mode to inhibit the transmission node ndT from being driven, regardless of the second internal data ID2 which is set to have a logic "high" level to drive the transmission data TD to a logic "low" level. The drive circuit 103a may inhibit the transmission data TD from being driven to a logic "low" level in the operation mode, thereby reducing an amount of a current which is consumed to drive the transmission data TD.

The reception device 110a may include a data reception circuit 111a and a termination circuit 113a.

The data reception circuit 111a may receive the transmission data TD, which is input to the reception pin 130a, through the reception node ndR. The data reception circuit 111a may be realized using a buffer circuit A11 that receives the transmission data TD based on a reference voltage VREF to generate reception data D_R. The data reception circuit 111a may buffer or amplify the transmission data TD using the reference voltage VREF as a reference logic level to output the buffered data or the amplified data as the reception data D_R. In the reception device 110a, the reception data D_R may be used to monitor a state of the transmission device 100a and may also be used to control the transmission device 100a.

The termination circuit 113a may be realized using a resistive element R11, which is electrically coupled between the reception node ndR receiving the transmission data TD and the ground voltage VSS terminal, to function as an impedance matching circuit. The resistive element R11 may be designed to have an impedance value which is matched with an impedance value of the transmission line L100a through which the transmission data TD are transmitted. The reception node ndR may be driven to have a logic "low" level by the resistive element R11 connected to the ground voltage VSS terminal. Thus, even though the second drive control signal DCNT2 is inactivated to have a logic "low" level regardless of the second internal data ID2 in the operation mode such that the transmission data TD are not driven to a logic "low" level, the reception device 110a may receive a signal of the reception node ndR which is driven to have a logic "low" level.

The electronic system 1a according to the present embodiments may provide the operation mode in which the second drive control signal DCNT2 is inactivated to have a logic "low" level when the transmission data TD are driven to have a logic "low" level by the termination circuit 113a included in the reception device 110a, thereby reducing an amount of a current that is consumed to generate the second drive control signal DCNT2. In addition, the electronic system 1a according to the present embodiments may provide the operation mode inactivating an operation of the drive circuit 103a driving the transmission data TD to a logic "low" level when the transmission data TD are driven to a logic "low" level by the termination circuit 113a included in the reception device 110a, thereby reducing an amount of a current that is consumed to drive the transmission data TD.

Figure 3:
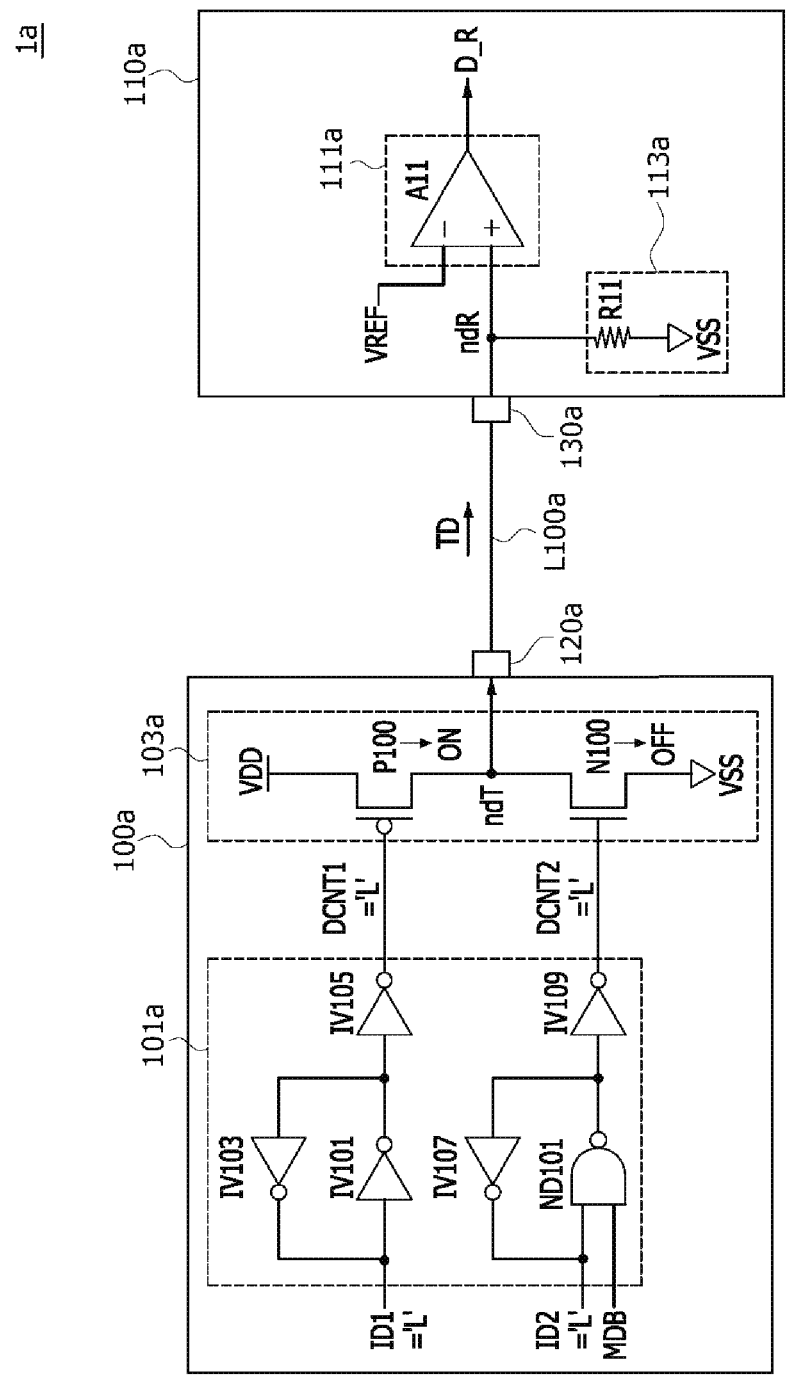
FIGS. 3, 4, and 5 are circuit diagrams illustrating an operation of the electronic system illustrated in FIG. 2.
Figure 4:
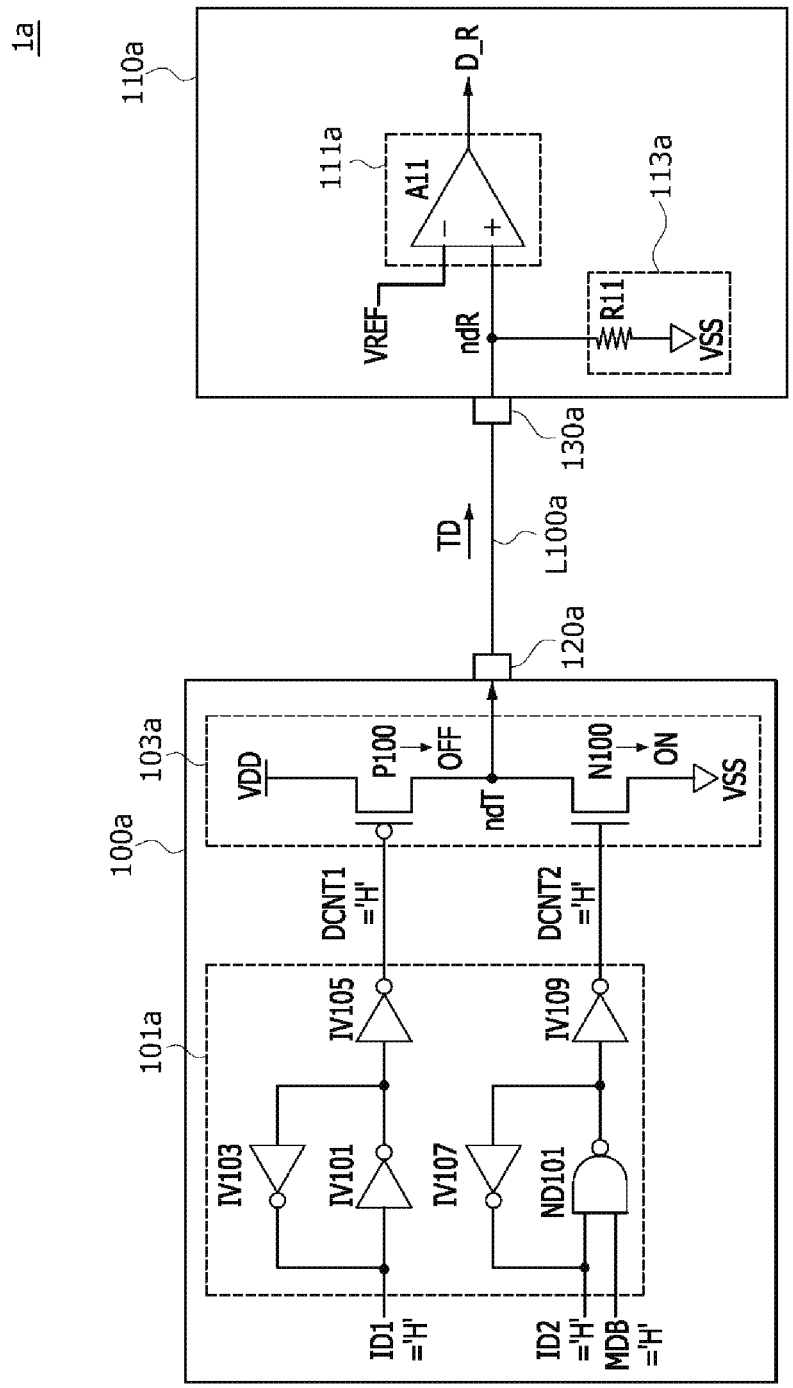
Figure 5:
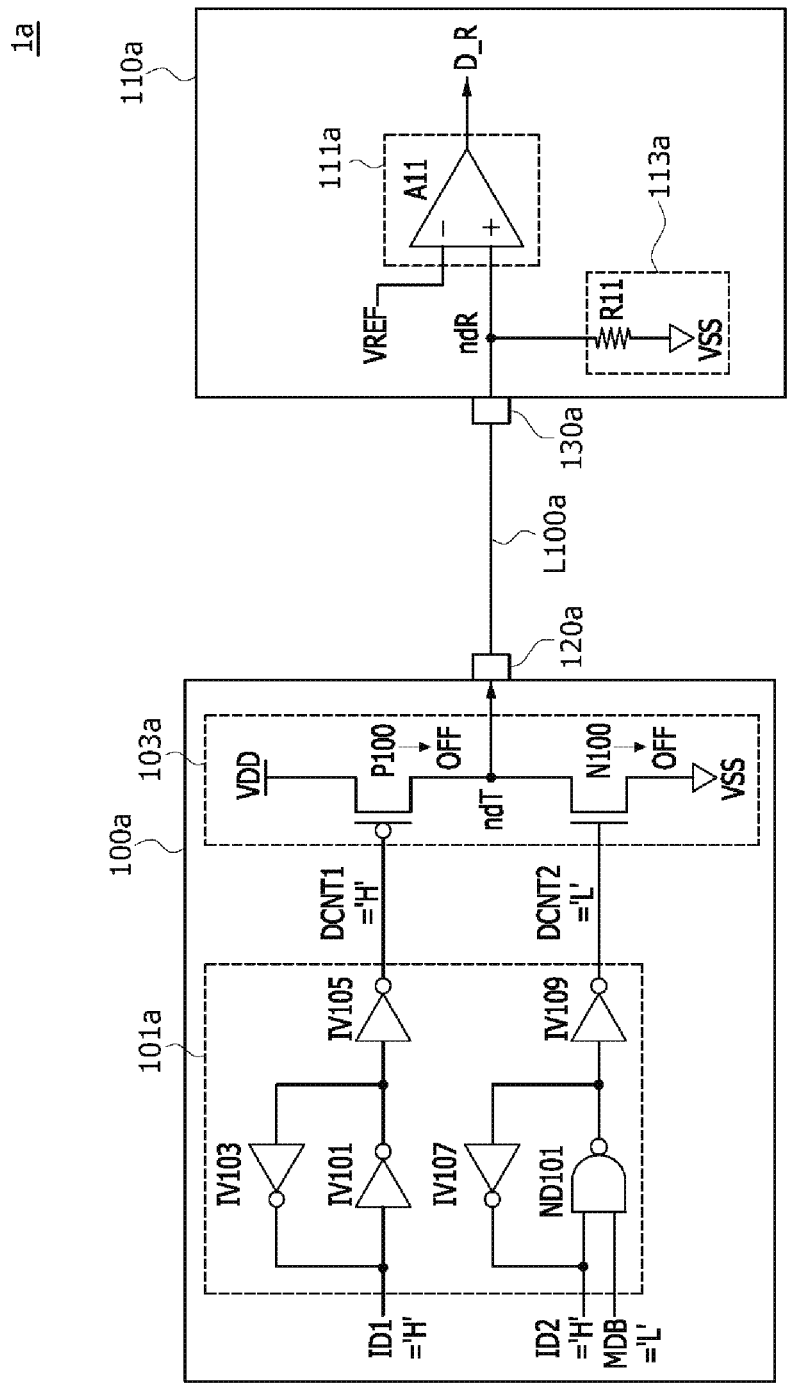

FIGS. 3 to 5 are circuit diagrams illustrating operations of the electronic system 1a.

Referring to FIG. 3, an operation that the transmission device 100a transmits the transmission data TD driven to a logic "high" level through the transmission pin 120a and the reception device 110a receives the transmission data TD through the transmission line L100a and the reception pin 130a is illustrated. In order to drive the transmission data TD to a logic "high" level, both of the first internal data ID1 and the second internal data ID2 may be set to have a logic "low(L)" level. Thus, the first drive control signal DCNT1 may be activated to have a logic "low(L)" level by the first internal data ID1 and the second drive control signal DCNT2 may be inactivated to have a logic "low(L)" level by the second internal data ID2 regardless of whether the operation mode is activated or not. In such a case, because the PMOS transistor P100 is turned on by the first internal data ID1 and the NMOS transistor N100 is turned off by the second internal data ID2, the transmission node ndT may be driven to a logic "high(H)" level. The transmission device 100a may output the transmission data TD driven to a logic "high" level through the transmission pin 120a. The reception device 110a may receive the transmission data TD through the transmission line L100a and the reception pin 130a.

Referring to FIG. 4, an operation that the transmission device 100a transmits the transmission data TD driven to a logic "low" level through the transmission pin 120a out of the operation mode and the reception device 110a receives the transmission data TD through the transmission line L100a and the reception pin 130a is illustrated. In order to drive the transmission data TD to a logic "low" level, both of the first internal data ID1 and the second internal data ID2 may be set to have a logic "high(H)" level. Thus, the first drive control signal DCNT1 may be inactivated to have a logic "high(H)" level by the first internal data ID1 and the second drive control signal DCNT2 may be activated to have a logic "high(H)" level by the second internal data ID2. In such a case, because the PMOS transistor P100 is turned off by the first internal data ID1 and the NMOS transistor N100 is turned on by the second internal data ID2, the transmission node ndT may be driven to a logic "low(L)" level. The transmission device 100a may output the transmission data TD driven to a logic "low" level through the transmission pin 120a. The reception device 110a may receive the transmission data TD through the transmission line L100a and the reception pin 130a.

Referring to FIG. 5, an operation that the transmission device 100a drives the transmission data TD to a logic "low" level while the mode signal MDB is set to have a logic "low" level to enter the operation mode and the reception node ndR is driven to have a logic "low" level is illustrated. In order to drive the transmission data TD to a logic "low" level, both of the first internal data ID1 and the second internal data ID2 may be set to have a logic "high(H)" level. Thus, the first drive control signal DCNT1 may be inactivated to have a logic "high(H)" level by the first internal data ID1, and the second drive control signal DCNT2 may also be inactivated to have a logic "low(L)" level by the second internal data ID2 and the mode signal MDB. In such a case, because the second drive control signal DCNT2 maintains the inactivated state having a logic "low(L)" level by the mode signal MDB having a logic "low" level in the operation mode, it may be possible to reduce an amount of a current which is consumed to generate the second drive control signal DCNT2. That is, because the PMOS is turned off by the first drive control signal DCNT1 and the NMOS transistor N100 is turned off by the second drive control signal DCNT2, the transmission node ndT is not driven. Accordingly, it may be possible to reduce power consumption of the reception device 110a.

Figure 6:
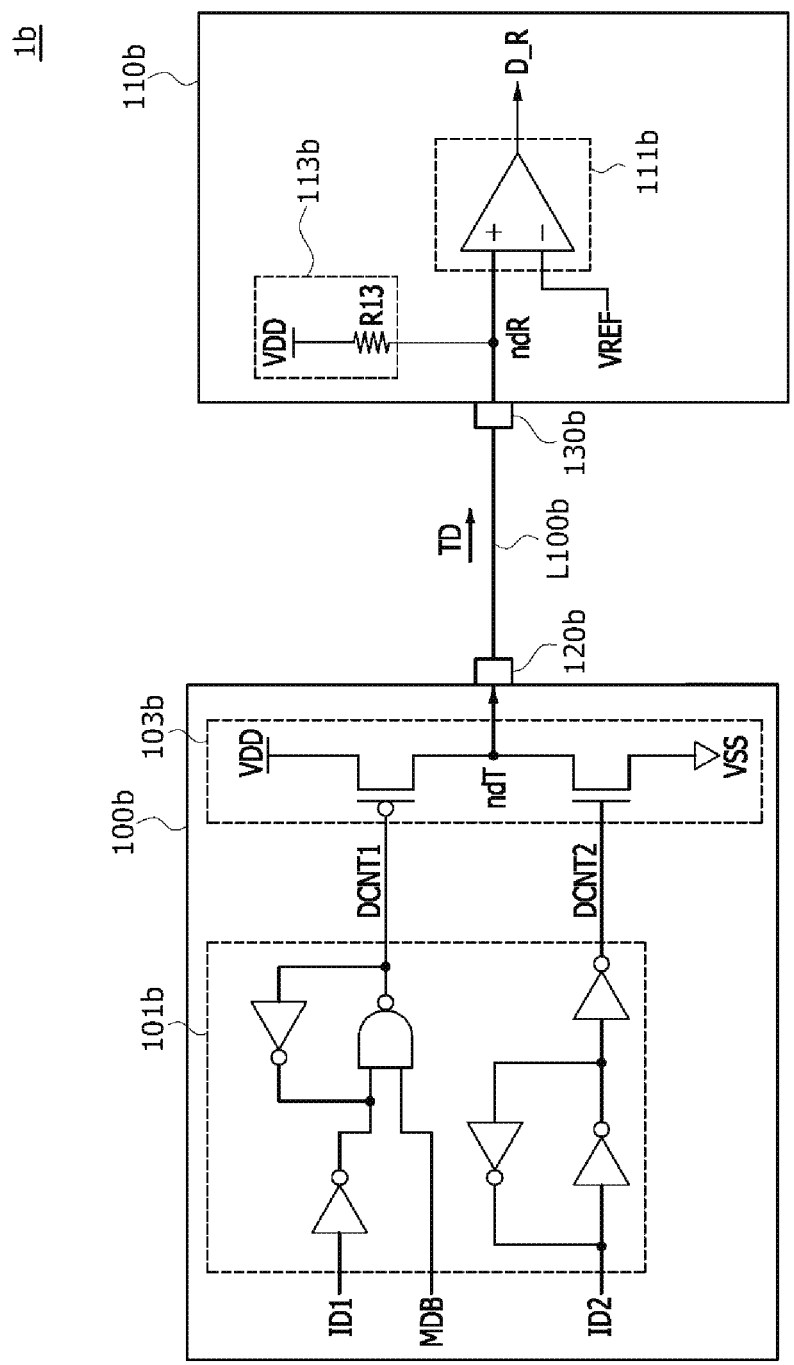
FIG. 6 is a circuit diagram illustrating another example of the electronic system illustrated in FIG. 1.

FIG. 6 is a circuit diagram of an electronic system 1b corresponding to another example of the electronic system 1 illustrated in FIG. 1. As illustrated in FIG. 6, the electronic system 1b may include a transmission device 100b and a reception device 110b. The transmission device 100b and the reception device 110b may be electrically connected to each other through a transmission pin 120b and a reception pin 130b. The transmission device 100b may output transmission data TD, which are driven according to an internal operation of the transmission device 100b, through the transmission pin 120b. The transmission data TD may be transmitted from the transmission pin 120b to the reception pin 130b through a transmission line L100b. The reception device 110b may receive the transmission data TD through the reception pin 130b. The reception device 110b may monitor a state of the transmission device 100b or may control the transmission device 100b, based on the transmission data TD. The reception device 110b may include an impedance matching circuit, which is connected to a reception node ndR to which the transmission data TD are input through the reception pin 130b, to drive the reception node ndR to a logic "high" level.

The transmission device 100b may include a drive control signal generation circuit 101b and a drive circuit 103b.

The drive control signal generation circuit 101b may generate a first drive control signal DCNT1 and a second drive control signal DCNT2 based on a first internal data ID1, a second internal data ID2, and a mode signal MDB. While the mode signal MDB is inactivated to have a logic "high" level out of the operation mode, the drive control signal generation circuit 101b may latch the first internal data ID1 and may buffer the first internal data ID1 to output the buffered data of the first internal data ID1 as the first drive control signal DCNT1. While the mode signal MDB is activated to have a logic "low" level in the operation mode, the drive control signal generation circuit 101b may inactivate the first drive control signal DCNT1 to a logic "high" level regardless of the first internal data ID1. The drive control signal generation circuit 101b may latch the second internal data ID2 and may buffer the second internal data ID2 to output the buffered data of the second internal data ID2 as the second drive control signal DCNT2. When the transmission data TD are driven to a logic "high" level while the reception node ndR is driven to have a logic "high" level in the operation mode, the drive control signal generation circuit 101b may inactivate the first drive control signal DCNT1 to reduce an amount of a current which is consumed to generate the first drive control signal DCNT1.

The drive circuit 103b may drive a transmission node ndT based on the first drive control signal DCNT1 and the second drive control signal DCNT2. The drive circuit 103b may drive the transmission node ndT to a logic "high" level when the first drive control signal DCNT1 is activated to have a logic "low" level while the operation mode is inactivated and may drive the transmission node ndT to a logic "low" level when the second drive control signal DCNT2 is activated to have a logic "high" level. The drive circuit 103b may receive the first drive control signal DCNT1 inactivated to a logic "high" level in the operation mode to inhibit the transmission node ndT from being driven, regardless of the first internal data ID1 which is set to have a logic "low" level to drive the transmission data TD to a logic "high" level. The drive circuit 103b may inhibit the transmission data TD from being driven to a logic "high" level in the operation mode, thereby reducing an amount of a current which is consumed to drive the transmission data TD.

The reception device 110b may include a data reception circuit 111b and a termination circuit 113b.

The data reception circuit 111b may receive the transmission data TD, which is input to the reception pin 130b, through the reception node ndR. The data reception circuit 111b may buffer or amplify the transmission data TD using the reference voltage VREF as a reference logic level to output the buffered data or the amplified data as the reception data D_R. In the reception device 110b, the reception data D_R may be used to monitor a state of the transmission device 100b and may also be used to control the transmission device 100b.

The termination circuit 113b may be realized using a resistive element R13, which is electrically coupled between the reception node ndR receiving the transmission data TD and the power supply voltage VDD terminal, to function as an impedance matching circuit. The resistive element R13 may be designed to have an impedance value which is matched with an impedance value of the transmission line L100b through which the transmission data TD are transmitted. The reception node ndR may be driven to have a logic "high" level by the resistive element R13 connected to the power supply voltage VDD terminal. Thus, even though the first drive control signal DCNT1 is inactivated to have a logic "high" level regardless of the first internal data ID1 in the operation mode, the reception device 110b may receive a signal of the reception node ndR which is driven to have a logic "high" level.

The electronic system 1b according to the present embodiments may provide the operation mode in which the first drive control signal DCNT1 is inactivated when the transmission data TD are driven to have a logic "high" level by the termination circuit 113b included in the reception device 110b, thereby reducing an amount of a current that is consumed to generate the first drive control signal DCNT1. In addition, the electronic system 1b according to the present embodiments may provide the operation mode inactivating an operation of the drive circuit 103b driving the transmission data TD to a logic "high" level when the transmission data TD are driven to a logic "high" level by the termination circuit 113b included in the reception device 110b, thereby reducing an amount of a current that is consumed to drive the transmission data TD.

Figure 7:
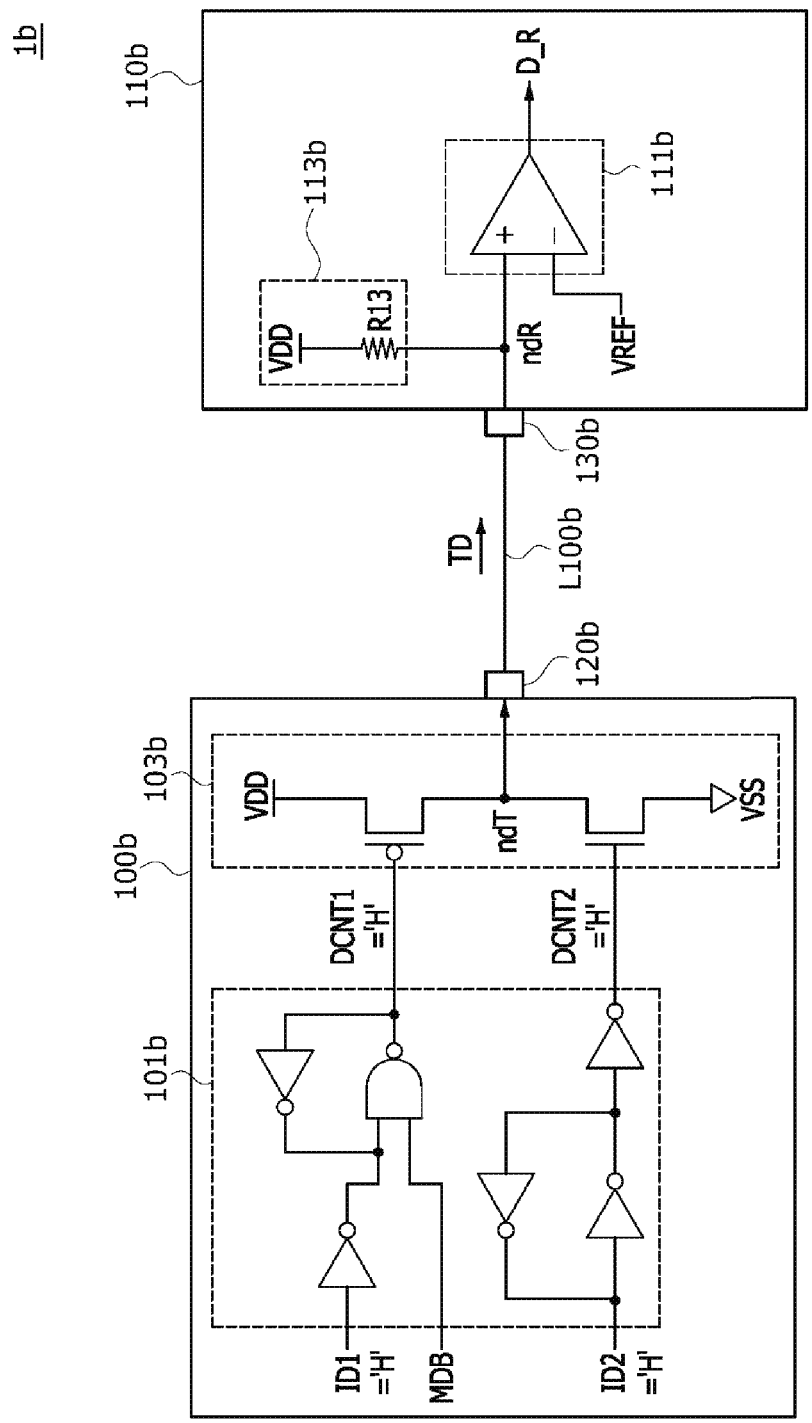
FIGS. 7, 8, and 9 are circuit diagrams illustrating an operation of the electronic system illustrated in FIG. 6.
Figure 8:
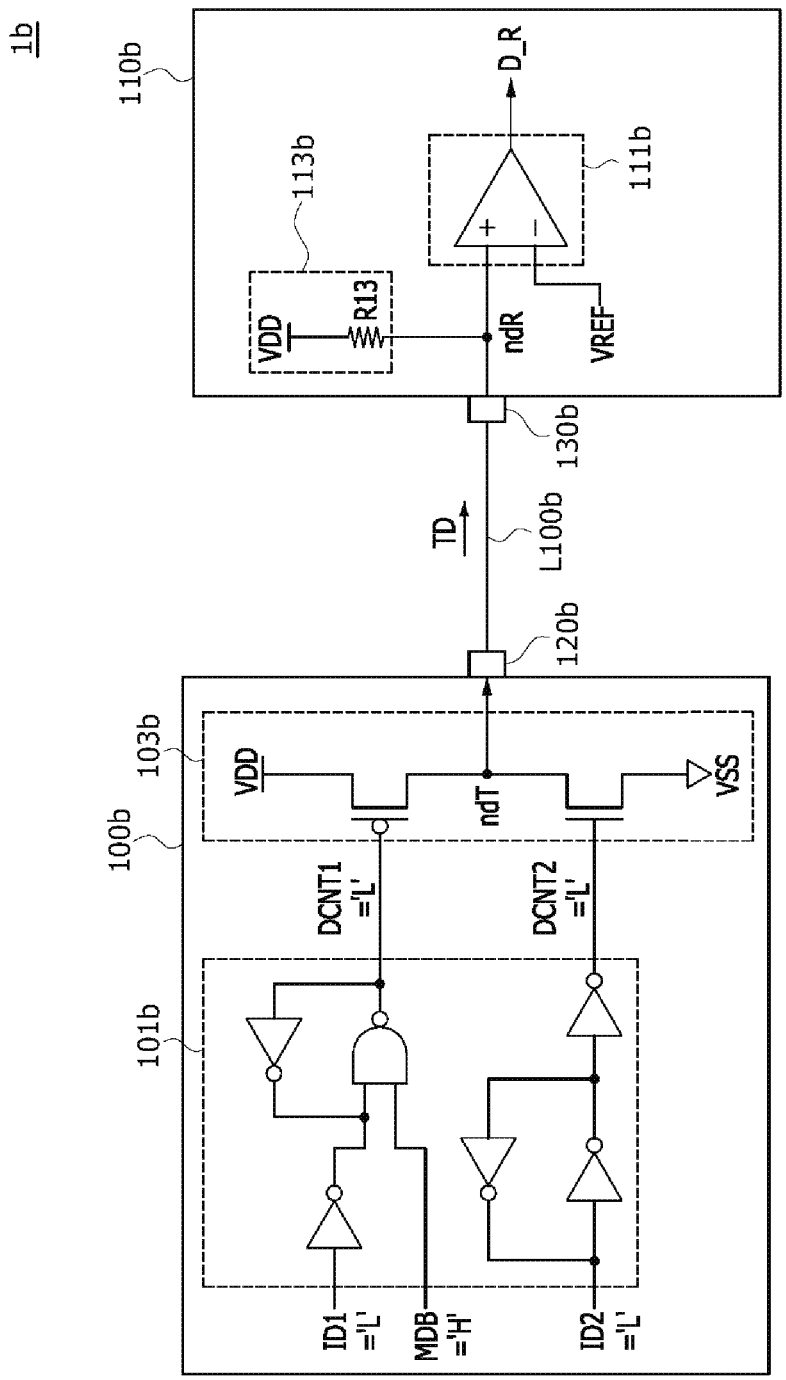
Figure 9:
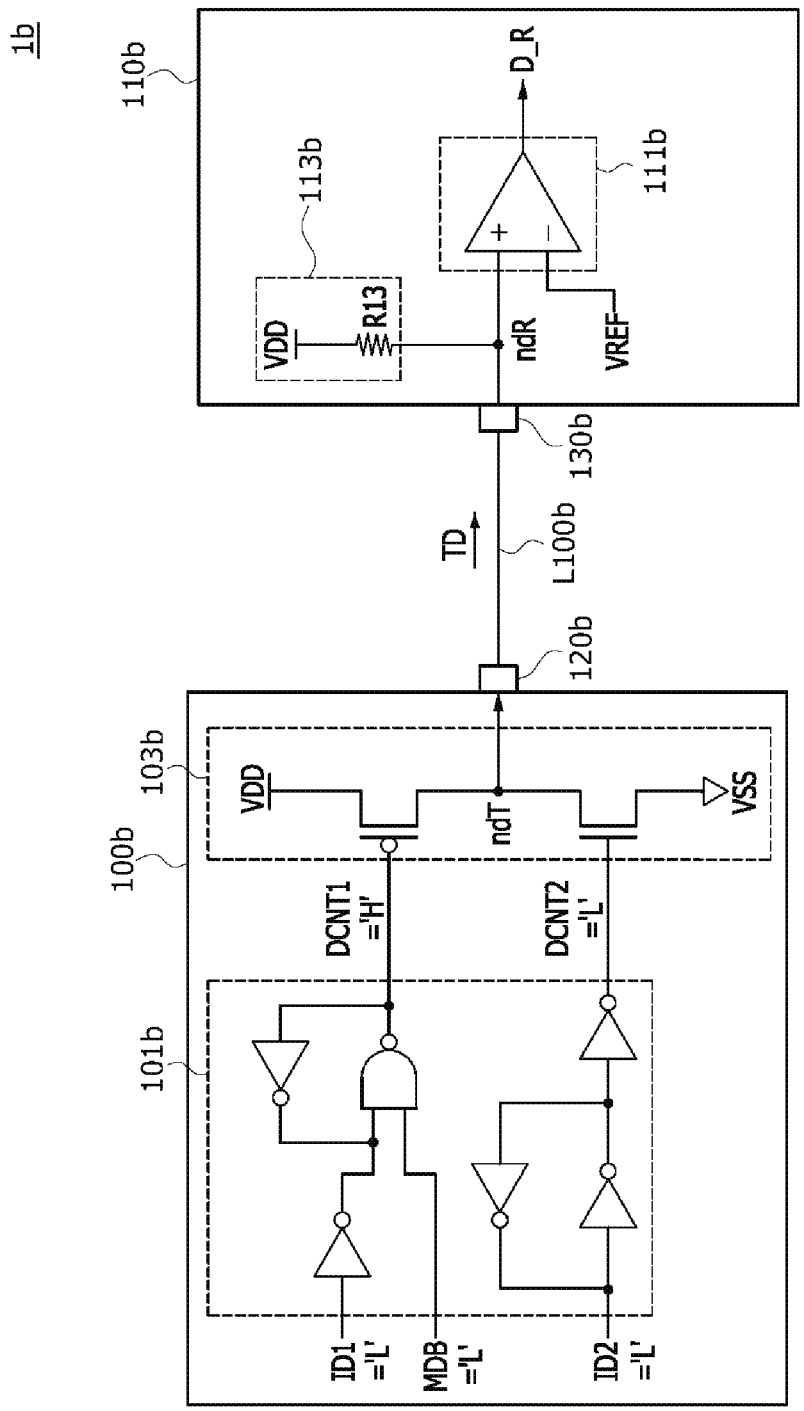

FIGS. 7 to 9 are circuit diagrams illustrating operations of the electronic system 1b.

Referring to FIG. 7, an operation that the transmission device 100b transmits the transmission data TD driven to a logic "low" level through the transmission pin 120b and the reception device 110b receives the transmission data TD through the transmission line L100b and the reception pin 130b is illustrated. In order to drive the transmission data TD to a logic "low" level, both of the first internal data ID1 and the second internal data ID2 may be set to have a logic "high(H)" level. Thus, the second drive control signal DCNT2 may be activated to have a logic "high(H)" level by the second internal data ID2, and the transmission node ndT may be driven to a logic "low(L)" level regardless of whether the operation mode is activated or not. The transmission device 100b may output the transmission data TD driven to a logic "low" level through the transmission pin 120b. The reception device 110b may receive the transmission data TD through the transmission line L100b and the reception pin 130b.

Referring to FIG. 8, an operation that the transmission device 100b transmits the transmission data TD driven to a logic "high" level through the transmission pin 120b out of the operation mode and the reception device 110b receives the transmission data TD through the transmission line L100b and the reception pin 130b is illustrated. In order to drive the transmission data TD to a logic "high" level, both of the first internal data ID1 and the second internal data ID2 may be set to have a logic "low(L)" level. Thus, the first drive control signal DCNT1 may be activated to have a logic "low(L)" level by the first internal data ID1 and the mode signal MDB, and the transmission node ndT may be driven to a logic "high(H)" level. The transmission device 100b may output the transmission data TD driven to a logic "high" level through the transmission pin 120b. The reception device 110b may receive the transmission data TD through the transmission line L100b and the reception pin 130b.

Referring to FIG. 9, an operation that the reception device 110b receives the transmission data TD driven to a logic "high" level through the transmission line L100b and the reception pin 130b while the mode signal MDB is set to have a logic "low" level to enter the operation mode and the reception node ndR is driven to have a logic "high" level is illustrated. Because the first drive control signal DCNT1 maintains the inactivated state having a logic "high(L)" level by the mode signal MDB having a logic "low" level in the operation mode, it may be possible to reduce an amount of a current which is consumed to generate the first drive control signal DCNT1. That is, because the transmission node ndT is not driven to a logic "high" level in the operation mode, it may be possible to reduce power consumption of the electronic system 1b.

Figure 10:
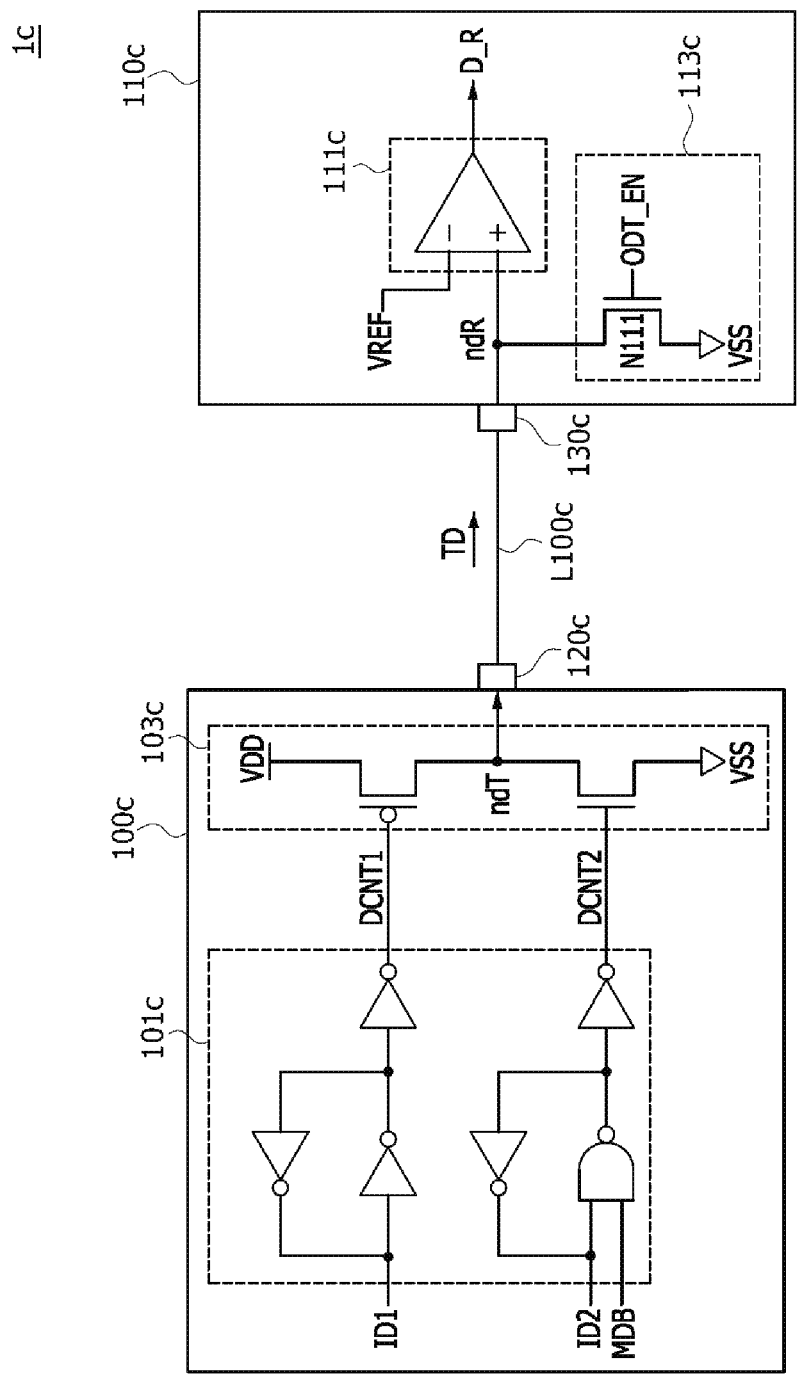
FIGS. 10 and 11 are circuit diagrams illustrating other examples of the electronic system illustrated in FIG. 1.

FIG. 10 is a circuit diagram of an electronic system 1c corresponding to yet another example of the electronic system 1 illustrated in FIG. 1. As illustrated in FIG. 10, the electronic system 1c may include a transmission device 100c and a reception device 110c. The transmission device 100c and the reception device 110c may be electrically connected to each other through a transmission pin 120c and a reception pin 130c. The transmission device 100c may output transmission data TD, which are driven according to an internal operation of the transmission device 100c, through the transmission pin 120c. The transmission data TD may be transmitted from the transmission pin 120c to the reception pin 130c through a transmission line L100c. The reception device 110c may receive the transmission data TD through the reception pin 130c. The reception device 110c may monitor a state of the transmission device 100c or may control the transmission device 100c, based on the transmission data TD. The reception device 110c may include an impedance matching circuit, which is connected to a reception node ndR to which the transmission data TD are input through the reception pin 130c, to drive the reception node ndR to a logic "low" level.

The transmission device 100c may include a drive control signal generation circuit 101c and a drive circuit 103c.

The drive control signal generation circuit 101c may generate a first drive control signal DCNT1 and a second drive control signal DCNT2 based on a first internal data ID1, a second internal data ID2, and a mode signal MDB. The drive control signal generation circuit 101c may latch the first internal data ID1 and may buffer the first internal data ID1 to output the buffered data of the first internal data ID1 as the first drive control signal DCNT1. While the mode signal MDB is inactivated to have a logic "high" level out of the operation mode, the drive control signal generation circuit 101c may latch the second internal data ID2 and may buffer the second internal data ID2 to output the buffered data of the second internal data ID2 as the second drive control signal DCNT2. While the mode signal MDB is activated to have a logic "low" level in the operation mode, the drive control signal generation circuit 101c may inactivate the second drive control signal DCNT2 to a logic "low" level regardless of the second internal data ID2. While the reception node ndR is driven to have a logic "low" level in the operation mode, the drive control signal generation circuit 101c may inactivate the second drive control signal DCNT2 to reduce an amount of a current which is consumed to generate the second drive control signal DCNT2.

The drive circuit 103c may drive a transmission node ndT based on the first drive control signal DCNT1 and the second drive control signal DCNT2. The drive circuit 103c may drive the transmission node ndT to a logic "high" level when the first drive control signal DCNT1 is activated to have a logic "low" level while the operation mode is inactivated and may drive the transmission node ndT to a logic "low" level when the second drive control signal DCNT2 is activated to have a logic "high" level. In the operation mode, the drive circuit 103c may drive the transmission node ndT to a logic "high" level when the first drive control signal DCNT1 is activated to have a logic "low" level and may inhibit the transmission node ndT from being driven according to the second drive control signal DCNT2 inactivated to have a logic "low" level regardless of the second internal data ID2. In the operation mode, the drive circuit 103c may receive the second drive control signal DCNT2 inactivated to a logic "low" level to inhibit the transmission node ndT from being driven, regardless of the second internal data ID2 which is set to have a logic "high" level to drive the transmission data TD to a logic "low" level. The drive circuit 103c may inhibit the transmission data TD from being driven to a logic "low" level in the operation mode, thereby reducing an amount of a current which is consumed to drive the transmission data TD.

The reception device 110c may include a data reception circuit 111c and a termination circuit 113c.

The data reception circuit 111c may receive the transmission data TD, which is input to the reception pin 130c, through the reception node ndR. The data reception circuit 111c may buffer or amplify the transmission data TD using the reference voltage VREF as a reference logic level to output the buffered data or the amplified data as the reception data D_R. In the reception device 110c, the reception data D_R may be used to monitor a state of the transmission device 100c and may also be used to control the transmission device 100c.

The termination circuit 113c may be realized using an NMOS transistor N111, which is electrically coupled between the reception node ndR receiving the transmission data TD and the ground voltage VSS terminal and is turned on by a termination activation signal ODT_EN, to function as an impedance matching circuit. The termination activation signal ODT_EN may be activated to have a logic "high" level when an impedance matching operation is performed. The NMOS transistor N111 turned on by termination activation signal ODT_EN may be designed to have an impedance value which is matched with an impedance value of the transmission line L100c through which the transmission data TD are transmitted. The reception node ndR may be driven to have a logic "low" level by the NMOS transistor N111 connected to the ground voltage VSS terminal. Thus, even though the second drive control signal DCNT2 is inactivated to have a logic "low" level regardless of the second internal data ID2 in the operation mode, the reception device 110c may receive a signal of the reception node ndR which is driven to have a logic "low" level.

The electronic system 1c according to the present embodiments may provide the operation mode in which the second drive control signal DCNT2 is inactivated to have a logic "low" level when the transmission data TD are driven to have a logic "low" level by the termination circuit 113c included in the reception device 110c, thereby reducing an amount of a current that is consumed to generate the second drive control signal DCNT2. In addition, the electronic system 1c according to the present embodiments may provide the operation mode inactivating an operation of the drive circuit 103c driving the transmission data TD to a logic "low" level when the transmission data TD are driven to a logic "low" level by the termination circuit 113c included in the reception device 110c, thereby reducing an amount of a current that is consumed to drive the transmission data TD.

Figure 11:
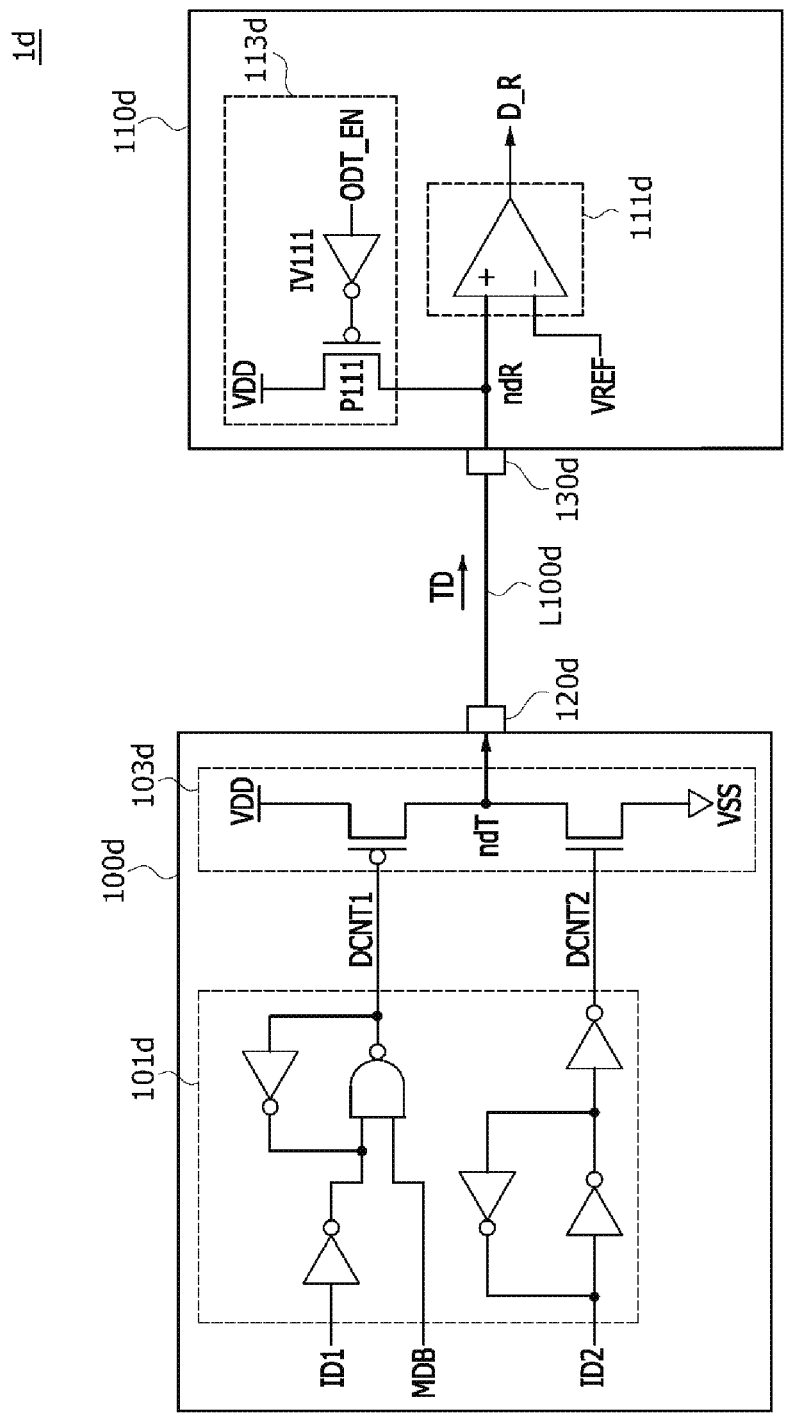

FIG. 11 is a circuit diagram of an electronic system 1d corresponding to still another example of the electronic system 1 illustrated in FIG. 1. As illustrated in FIG. 11, the electronic system 1d may include a transmission device 100d and a reception device 110d. The transmission device 100d and the reception device 110d may be electrically connected to each other through a transmission pin 120d and a reception pin 130d. The transmission device 100d may output transmission data TD, which are driven according to an internal operation of the transmission device 100d, through the transmission pin 120d. The transmission data TD may be transmitted from the transmission pin 120d to the reception pin 130d through a transmission line L100d. The reception device 110d may receive the transmission data TD through the reception pin 130d. The reception device 110d may monitor a state of the transmission device 100d or may control the transmission device 100d, based on the transmission data TD. The reception device 110d may include an impedance matching circuit, which is connected to a reception node ndR to which the transmission data TD are input through the reception pin 130d, to drive the reception node ndR to a logic "high" level.

The transmission device 100d may include a drive control signal generation circuit 101d and a drive circuit 103d.

The drive control signal generation circuit 101d may generate a first drive control signal DCNT1 and a second drive control signal DCNT2 based on a first internal data ID1, a second internal data ID2, and a mode signal MDB. While the mode signal MDB is inactivated to have a logic "high" level out of the operation mode, the drive control signal generation circuit 101d may latch the first internal data ID1 and may buffer the first internal data ID1 to output the buffered data of the first internal data ID1 as the first drive control signal DCNT1. While the mode signal MDB is activated to have a logic "low" level in the operation mode, the drive control signal generation circuit 101d may inactivate the first drive control signal DCNT1 to a logic "high" level regardless of the first internal data ID1. The drive control signal generation circuit 101d may latch the second internal data ID2 and may buffer the second internal data ID2 to output the buffered data of the second internal data ID2 as the second drive control signal DCNT2. When the transmission data TD are driven to have a logic "high" level while the reception node ndR is driven to have a logic "high" level in the operation mode, the drive control signal generation circuit 101d may inactivate the first drive control signal DCNT1 to reduce an amount of a current which is consumed to generate the first drive control signal DCNT1.

The drive circuit 103d may drive a transmission node ndT based on the first drive control signal DCNT1 and the second drive control signal DCNT2. The drive circuit 103d may drive the transmission node ndT to a logic "high" level when the first drive control signal DCNT1 is activated to have a logic "low" level while the operation mode is inactivated and may drive the transmission node ndT to a logic "low" level when the second drive control signal DCNT2 is activated to have a logic "high" level. In the operation mode, the drive circuit 103d may receive the first drive control signal DCNT1 inactivated to a logic "high" level to inhibit the transmission node ndT from being driven, regardless of the first internal data ID1 which is set to have a logic "low" level to drive the transmission data TD to a logic "high" level. In the operation mode, the drive circuit 103d may inhibit the transmission data TD from being driven to have a logic "high" level to reduce an amount of a current which is consumed to drive the transmission data TD.

The reception device 110d may include a data reception circuit 111d and a termination circuit 113d.

The data reception circuit 111d may receive the transmission data TD, which is input to the reception pin 130d, through the reception node ndR. The data reception circuit 111d may buffer or amplify the transmission data TD using the reference voltage VREF as a reference logic level to output the buffered data or the amplified data as the reception data D_R. In the reception device 110d, the reception data D_R may be used to monitor a state of the transmission device 100d and may also be used to control the transmission device 100d.

The termination circuit 113d may be realized using a PMOS transistor P111, which is electrically coupled between the power supply voltage VDD terminal and the reception node ndR receiving the transmission data TD and is turned on by an output signal of an inverter IV111 inversely buffering a termination activation signal ODT_EN, to function as an impedance matching circuit. The PMOS transistor P111 turned on by termination activation signal ODT_EN may be designed to have an impedance value which is matched with an impedance value of the transmission line L100d through which the transmission data TD are transmitted. The reception node ndR may be driven to have a logic "high" level by the PMOS transistor P111 connected to the power supply voltage VDD terminal. Thus, even though the first drive control signal DCNT1 is inactivated to have a logic "high" level regardless of the first internal data ID1 in the operation mode, the reception device 110d may receive a signal of the reception node ndR which is driven to have a logic "high" level.

The electronic system 1d according to the present embodiments may provide the operation mode in which the first drive control signal DCNT1 is inactivated when the transmission data TD are driven to have a logic "high" level by the termination circuit 113d included in the reception device 110d, thereby reducing an amount of a current that is consumed to generate the first drive control signal DCNT1. In addition, the electronic system 1d according to the present embodiments may provide the operation mode inactivating an operation of the drive circuit 103d driving the transmission data TD to a logic "high" level when the transmission data TD are driven to a logic "high" level by the termination circuit 113d included in the reception device 110d, thereby reducing an amount of a current that is consumed to drive the transmission data TD.

Figure 12:
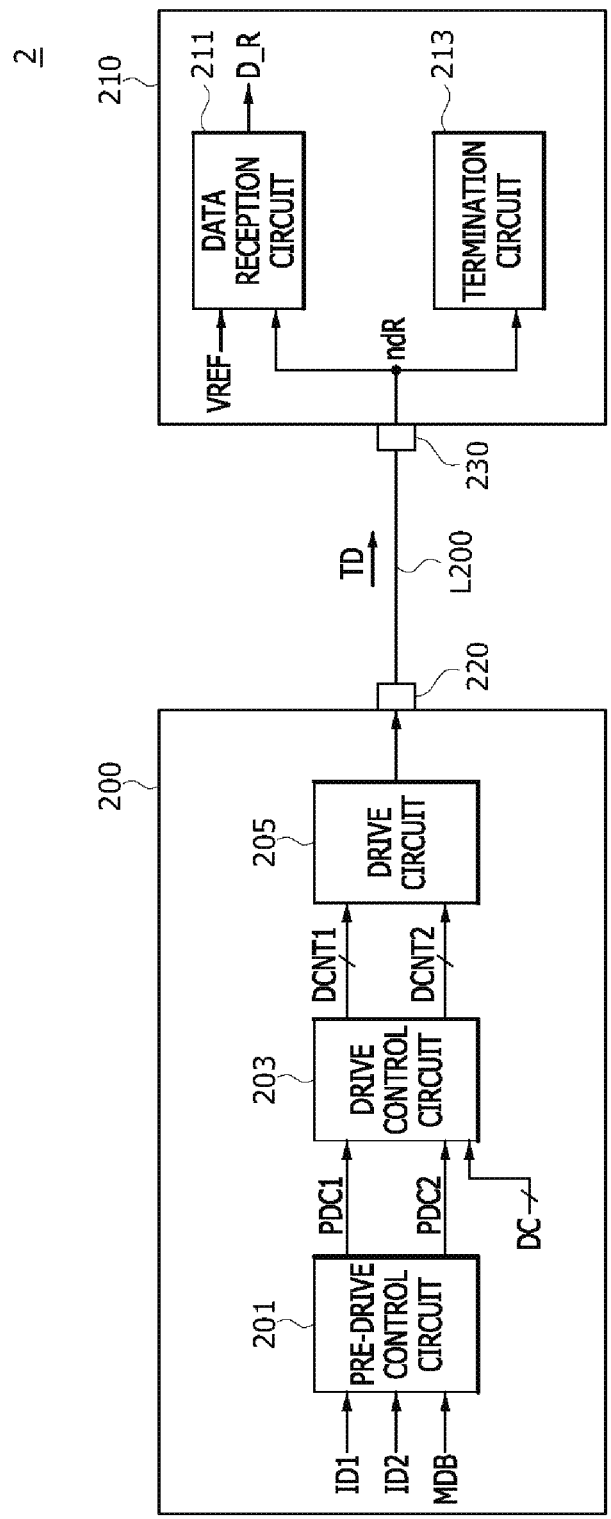
FIG. 12 is a block diagram illustrating a configuration of an electronic system according to another embodiment of the present disclosure.

FIG. 12 is a block diagram illustrating a configuration of an electronic system 2 according to another embodiment of the present disclosure.

As illustrated in FIG. 12, the electronic system 2 may include a transmission device 200 and a reception device 210. The transmission device 200 and the reception device 210 may be electrically connected to each other through a transmission pin 220 and a reception pin 230. The transmission device 200 may output transmission data TD, which are driven according to an internal operation of the transmission device 200, through the transmission pin 220. The transmission data TD may be transmitted from the transmission pin 220 to the reception pin 230 through a transmission line L200. The reception device 210 may receive the transmission data TD through the reception pin 230. The reception device 210 may monitor a state of the transmission device 200 or may control the transmission device 200, based on the transmission data TD.

The transmission device 200 may include a pre-drive control circuit 201, a drive control circuit 203, and a drive circuit 205.

The pre-drive control circuit 201 may generate a first pre-drive control signal PDC1 and a second pre-drive control signal PDC2 based on a first internal data ID1, a second internal data ID2, and a mode signal MDB. The pre-drive control circuit 201 may generate the first pre-drive control signal PDC1 which is activated by the first internal data ID1 when the transmission data TD are driven to a first logic level while the mode signal MDB is inactivated out of the operation mode. The pre-drive control circuit 201 may generate the second pre-drive control signal PDC2 which is activated by the second internal data ID2 when the transmission data TD are driven to a second logic level while the mode signal MDB is inactivated out of the operation mode. The pre-drive control circuit 201 may generate the first pre-drive control signal PDC1 which is activated by the first internal data ID1 when the transmission data TD are driven to the first logic level while the mode signal MDB is activated to enter the operation mode and a reception node ndR of the reception device 210 is driven to the second logic level. The pre-drive control circuit 201 may generate the second pre-drive control signal PDC2 which is activated by the second internal data ID2 when the transmission data TD are driven to the second logic level while the reception node ndR of the reception device 210 is driven to the first logic level in the operation mode. The pre-drive control circuit 201 may inactivate the second pre-drive control signal PDC2 regardless of the second internal data ID2 when the transmission data TD are driven to the second logic level while the reception node ndR of the reception device 210 is driven to the second logic level in the operation mode. Thus, it may be possible to reduce an amount of a current which is consumed to generate the second pre-drive control signal PDC2. The pre-drive control circuit 201 may inactivate the first pre-drive control signal PDC1 regardless of the first internal data ID1 when the transmission data TD are driven to the first logic level while the reception node ndR of the reception device 210 is driven to the first logic level in the operation mode. Thus, it may be possible to reduce an amount of a current which is consumed to generate the first pre-drive control signal PDC1.

The drive control circuit 203 may generate a first drive control signal DCNT1 and a second drive control signal DCNT2 based on the first pre-drive control signal PDC1, the second pre-drive control signal PDC2, and a drive code DC. The drive control circuit 203 may buffer the first pre-drive control signal PDC1 based on the drive code DC to generate the first drive control signal DCNT1. For example, when the number of bits included in each of the drive code DC and the first drive control signal DCNT1 is "N", the drive control circuit 203 may output the buffered signal of the first pre-drive control signal PDC1 as at least one selected by the drive code DC among "N"-number of bit signals included in the first drive control signal DCNT1. The drive control circuit 203 may buffer the second pre-drive control signal PDC2 based on the drive code DC to generate the second drive control signal DCNT2. For example, when the number of bits included in each of the drive code DC and the second drive control signal DCNT2 is "N", the drive control circuit 203 may output the buffered signal of the second pre-drive control signal PDC2 as at least one selected by the drive code DC among "N"-number of bit signals included in the second drive control signal DCNT2.

The drive circuit 205 may drive the transmission data TD using a drivability which is set by the first drive control signal DCNT1 and the second drive control signal DCNT2. The drivability of the drive circuit 205 for driving the transmission data TD may be determined according to the number of the bit signals, which are activated, among the bit signals included in each of the first drive control signal DCNT1 and the second drive control signal DCNT2. The drive circuit 205 may drive the transmission data TD to the first logic level when at least one of the bit signals included in the first drive control signal DCNT1 is activated and all of the bit sit signals included in the second drive control signal DCNT2 are inactivated while the operation mode is inactivated. The drive circuit 205 may drive the transmission data TD to the second logic level when all of the bit signals included in the first drive control signal DCNT1 are inactivated and at least one of the bit signals included in the second drive control signal DCNT2 is activated while the operation mode is inactivated.

The drive circuit 205 may receive the first drive control signal DCNT1, at least one bit of which is activated, and the second drive control signal DCNT2, all bits of which are inactivated, thereby driving the transmission data TD to the first logic level when the transmission data TD are driven to the first logic level while the reception node ndR is driven to the second logic level in the operation mode. The drive circuit 205 may receive the first drive control signal DCNT1, all bits of which are inactivated, and the second drive control signal DCNT2, all bits of which are inactivated, thereby inhibiting the transmission data TD from being driven when the transmission data TD are driven to the second logic level while the reception node ndR is driven to the second logic level in the operation mode. As a result, it may be possible to reduce power consumption of the electronic system 2. The drive circuit 205 may receive the first drive control signal DCNT1, all bits of which are inactivated and the second drive control signal DCNT2, at least one bit of which is activated, thereby driving the transmission data TD to the second logic level when the transmission data TD are driven to the second logic level while the reception node ndR is driven to the first logic level in the operation mode. The drive circuit 205 may receive the first drive control signal DCNT1, all bits of which are inactivated, and the second drive control signal DCNT2, all bits of which are inactivated, thereby inhibiting the transmission data TD from being driven when the transmission data TD are driven to the first logic level while the reception node ndR is driven to the first logic level in the operation mode. As a result, it may be possible to reduce power consumption of the electronic system 2.

The reception device 210 may include a data reception circuit 211 and a termination circuit 213.

The data reception circuit 211 may receive the transmission data TD, which is input to the reception pin 230, through the reception node ndR. The data reception circuit 211 may receive the transmission data TD to generate reception data D_R based on a reference voltage VREF. The data reception circuit 211 may buffer or amplify the transmission data TD using the reference voltage VREF as a reference logic level to output the buffered data or the amplified data as the reception data D_R. In the reception device 210, the reception data D_R may be used to monitor a state of the transmission device 200 and may also be used to control the transmission device 200.

The termination circuit 213 may be electrically connected to the reception node ndR through which the transmission data TD are input. The termination circuit 213 may be realized using an on-die termination circuit or an on-chip termination circuit to function as an impedance matching circuit. The termination circuit 213 may be designed to have an impedance value which is matched with an impedance value of the transmission line L200 through which the transmission data TD are transmitted. The termination circuit 213 may include a passive element or an active element that has an impedance value which is matched with an impedance value of the transmission line L200. The passive element or the active element included in the termination circuit 213 may drive the reception node ndR to the first logic level or the second logic level according to the embodiments.

The electronic system 2 according to the present embodiments may provide the operation mode in which all of bit signals included in the first drive control signal DCNT1 or the second drive control signal DCNT2 are inactivated when the transmission data TD are driven by the termination circuit 213 included in the reception device 210, thereby reducing an amount of a current that is consumed to generate the first drive control signal DCNT1 and the second drive control signal DCNT2. In addition, the electronic system 2 according to the present embodiments may provide the operation mode in which some of operations of the drive circuit 205 are inhibited when the transmission data TD are driven by the termination circuit 213 included in the reception device 210, thereby reducing an amount of a current that is consumed to drive the transmission data TD.

Figure 13:
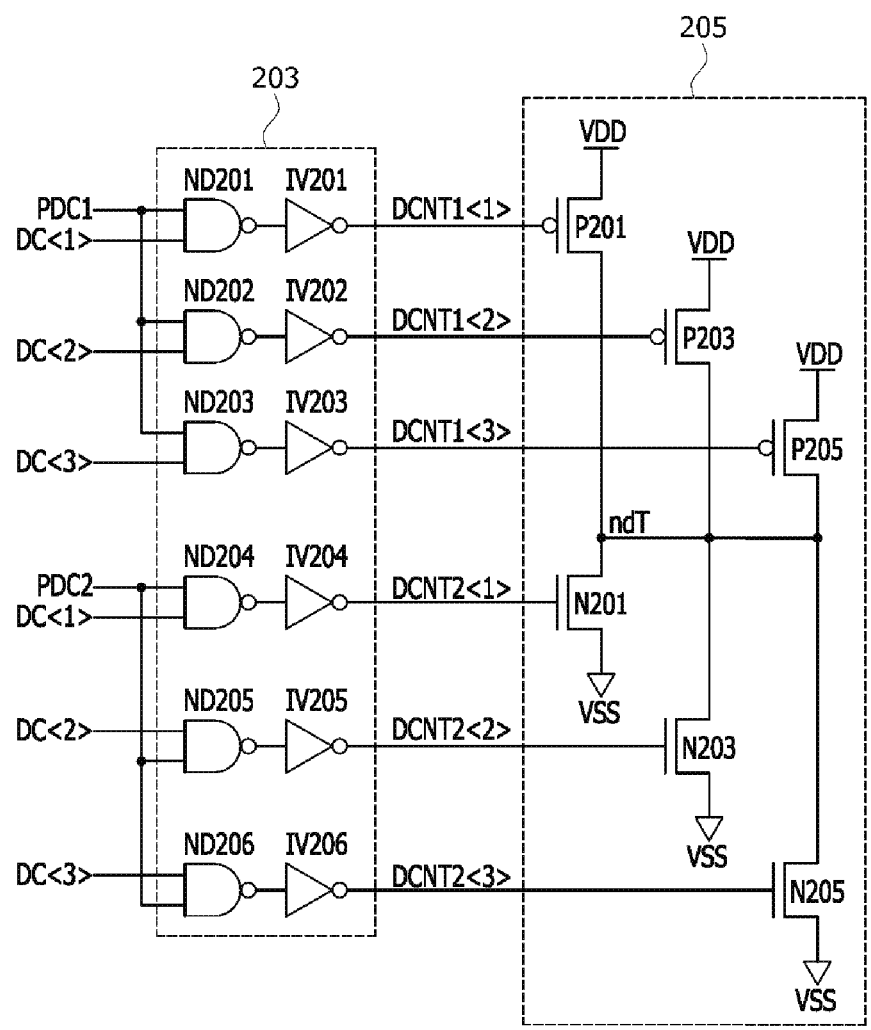
FIG. 13 is a circuit diagram illustrating examples of a drive control circuit and a drive circuit included in the electronic system illustrated in FIG. 12.

FIG. 13 is a circuit diagram illustrating the drive control circuit 203 and the drive circuit 205.

As illustrated in FIG. 13, the drive control circuit 203 may include NAND gates ND201, ND202, ND203, ND204, ND205, and ND206 and inverters IV201, IV202, IV203, IV204, IV205, and IV206. The NAND gate ND201 and the inverter IV201 may perform a logical AND operation of the first pre-drive control signal PDC1 and a first bit signal DC<1> of the drive code DC to generate a first bit signal DCNT1<1> of the first drive control signal DCNT1. The NAND gate ND202 and the inverter IV202 may perform a logical AND operation of the first pre-drive control signal PDC1 and a second bit signal DC<2> of the drive code DC to generate a second bit signal DCNT1<2> of the first drive control signal DCNT1. The NAND gate ND203 and the inverter IV203 may perform a logical AND operation of the first pre-drive control signal PDC1 and a third bit signal DC<3> of the drive code DC to generate a third bit signal DCNT1<3> of the first drive control signal DCNT1. The NAND gate ND204 and the inverter IV204 may perform a logical AND operation of the second pre-drive control signal PDC2 and the first bit signal DC<1> of the drive code DC to generate a first bit signal DCNT2<1> of the second drive control signal DCNT2. The NAND gate ND205 and the inverter IV205 may perform a logical AND operation of the second pre-drive control signal PDC2 and the second bit signal DC<2> of the drive code DC to generate a second bit signal DCNT2<2> of the second drive control signal DCNT2. The NAND gate ND206 and the inverter IV206 may perform a logical AND operation of the second pre-drive control signal PDC2 and the third bit signal DC<3> of the drive code DC to generate a third bit signal DCNT2<3> of the second drive control signal DCNT2.

The drive control circuit 203 may adjust the number of signals activated among the first bit signal DCNT1<1> of the first drive control signal DCNT1, the second bit signal DCNT1<2> of the first drive control signal DCNT1, the third bit signal DCNT1<3> of the first drive control signal DCNT1, the first bit signal DCNT2<1> of the second drive control signal DCNT2, the second bit signal DCNT2<2> of the second drive control signal DCNT2, and the third bit signal DCNT2<3> of the second drive control signal DCNT2, based on the first bit signal DC<1> of the drive code DC, the second bit signal DC<2> of the drive code DC, and the third bit signal DC<3> of the drive code DC. For example, when the first pre-drive control signal PDC1 activated to have a logic "high" level and the second pre-drive control signal PDC2 inactivated to have a logic "low" level are input to the drive control circuit 203 while the first bit signal DC<1> of the drive code DC has a logic "low" level and the second and third bit signals DC<2:3> of the drive code DC have a logic "high" level, the drive control circuit 203 may generate the first bit signal DCNT1<1> of the first drive control signal DCNT1 activated to have a logic "low" level, the second and third bit signals DCNT1<2:3> of the first drive control signal DCNT1 inactivated to have a logic "high" level, and the first to third bit signals DCNT2<1:3> of the second drive control signal DCNT2 inactivated to have a logic "low" level.

As illustrated in FIG. 13, the drive circuit 205 may include PMOS transistors P201, P203, and P205 and NMOS transistors N201, N203, and N205. The PMOS transistor P201 may be electrically coupled between a power supply voltage VDD terminal and a transmission node ndT and may be turned on according to the first bit signal DCNT1<1> of the first drive control signal DCNT1 to drive the transmission node ndT to a logic "high" level. The PMOS transistor P203 may be electrically coupled between the power supply voltage VDD terminal and the transmission node ndT and may be turned on according to the second bit signal DCNT1<2> of the first drive control signal DCNT1 to drive the transmission node ndT to a logic "high" level. The PMOS transistor P205 may be electrically coupled between the power supply voltage VDD terminal and the transmission node ndT and may be turned on according to the third bit signal DCNT1<3> of the first drive control signal DCNT1 to drive the transmission node ndT to a logic "high" level. The NMOS transistor N201 may be electrically coupled between the transmission node ndT and a ground voltage VSS terminal and may be turned on according to the first bit signal DCNT2<1> of the second drive control signal DCNT2 to drive the transmission node ndT to a logic "low" level. The NMOS transistor N203 may be electrically coupled between the transmission node ndT and the ground voltage VSS terminal and may be turned on according to the second bit signal DCNT2<2> of the second drive control signal DCNT2 to drive the transmission node ndT to a logic "low" level. The NMOS transistor N205 may be electrically coupled between the transmission node ndT and the ground voltage VSS terminal and may be turned on according to the third bit signal DCNT2<3> of the second drive control signal DCNT2 to drive the transmission node ndT to a logic "low" level.

The drive circuit 205 may drive the transmission node ndT according to signals which are activated among the first to third bit signals DCNT1<1:3> of the first drive control signal DCNT1 and the first to third bit signals DCNT2<1:3> of the second drive control signal DCNT2. For example, the drive circuit 205 may drive the transmission node ndT to a logic "high" level using the PMOS transistor P201 which is turned on when only the first bit signal DCNT1<1> of the first drive control signal DCNT1 is activated to have a logic "low" level and is input to the PMOS transistor P201.

Figure 14:
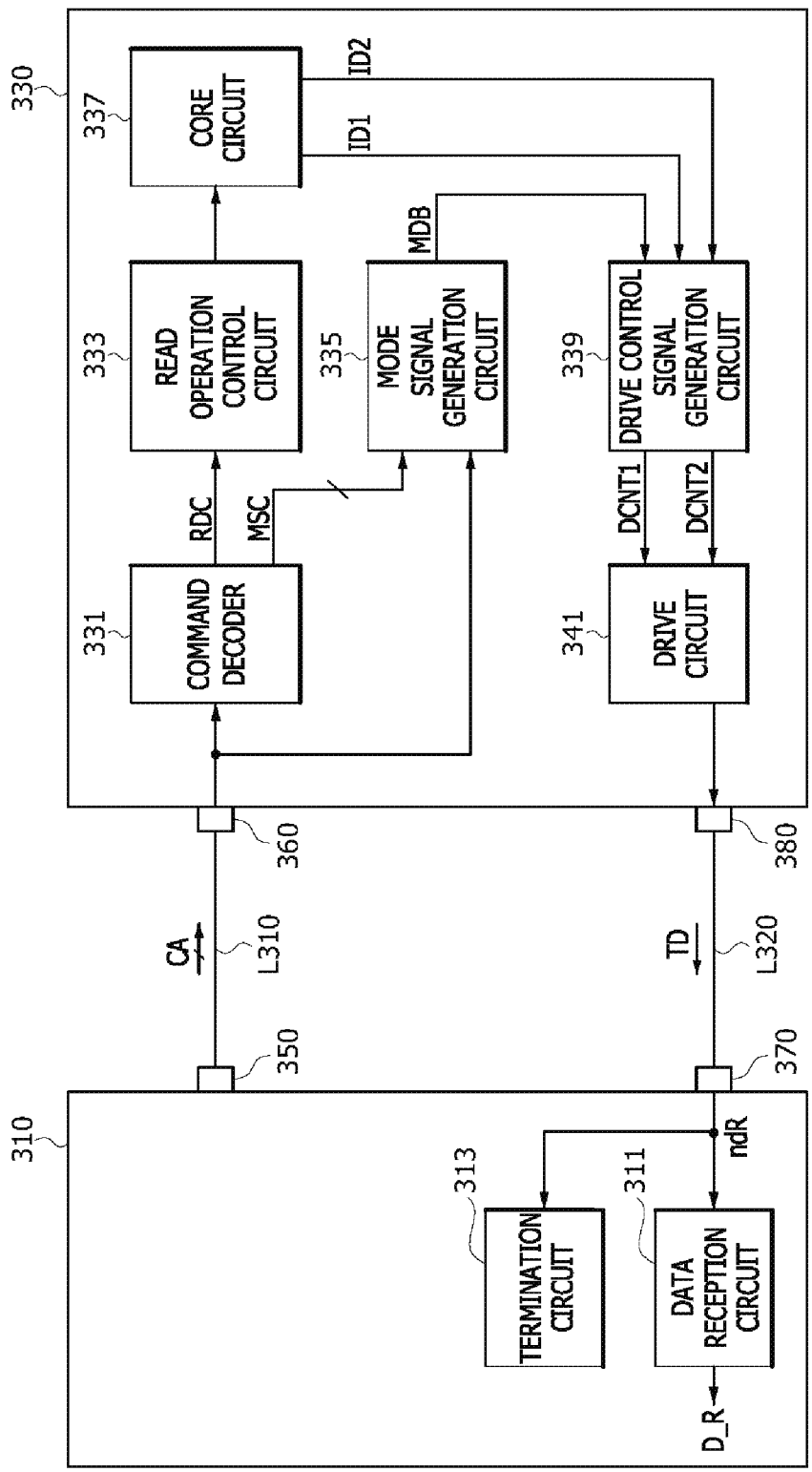
FIG. 14 is a block diagram illustrating a configuration of a semiconductor system according to an embodiment of the present disclosure.

FIG. 14 is a block diagram illustrating a configuration of a semiconductor system 3 according to an embodiment of the present disclosure. As illustrated in FIG. 14, the semiconductor system 3 may include a controller 310 and a memory device 330. The controller 310 and the memory device 330 may be electrically connected to each other through a first control pin 350, a first memory pin 360, a second control pin 370, and a second memory pin 380. The controller 310 may output a command CA through the first control pin 350 to perform a read operation. The memory device 330 may receive the command CA through a first transmission line L310 and the first memory pin 360 and may perform the read operation to output transmission data TD through the second memory pin 380. The controller 310 may receive the transmission data TD through a second transmission line L320 and the second control pin 370. The controller 310 may monitor a state of the memory device 330 or may control the memory device 330, based on the transmission data TD. The controller 310 may include an impedance matching circuit, which is connected to a reception node ndR to which the transmission data TD are input, to drive the reception node ndR to a first logic level or a second logic level according to the embodiments.

The controller 310 may include a data reception circuit 311 and a termination circuit 313.

The data reception circuit 311 may receive the transmission data TD, which is input to the second control pin 370, through the reception node ndR. The data reception circuit 311 may receive the transmission data TD to generate reception data D_R based on a reference voltage VREF. The data reception circuit 311 may buffer or amplify the transmission data TD using the reference voltage VREF as a reference logic level to output the buffered data or the amplified data as the reception data D_R.

The termination circuit 313 may be electrically connected to the reception node ndR through which the transmission data TD are input. The termination circuit 313 may be realized using an on-die termination circuit or an on-chip termination circuit to function as an impedance matching circuit. The termination circuit 313 may be designed to have an impedance value which is matched with an impedance value of the transmission line L320 through which the transmission data TD are transmitted. The termination circuit 313 may include a passive element or an active element that has an impedance value which is matched with an impedance value of the transmission line L320. The passive element or the active element included in the termination circuit 313 may drive the reception node ndR to the first logic level or the second logic level according to the embodiments.

The memory device 330 may include a command decoder 331, a read operation control circuit 333, a mode signal generation circuit 335, a core circuit 337, a drive control signal generation circuit 339, and a drive circuit 341.

The command decoder 331 may decode the command CA received through the first memory pin 360 to generate a read command RDC and a mode set command MSC. The command decoder 331 may generate the read command RDC when bit signals of the command CA have a first logic level combination. The read command RDC may be generated to perform the read operation for outputting first internal data ID1 and second internal data ID2 stored in the core circuit 337. The command decoder 331 may generate the mode set command MSC when the bit signals included in the command CA have a second logic level combination. The mode set command MSC may be generated to perform a mode set operation for extracting a mode signal MDB from the command CA and for storing the mode signal MDB. The first logic level combination of the bit signals included in the command CA for generating the read command RDC may be set to be different according to the embodiments. Similarly, the second logic level combination of the bit signals included in the command CA for generating the mode set command MSC may also be set to be different according to the embodiments.

The read operation control circuit 333 may control the read operation based on the read command RDC. The read operation control circuit 333 may control the core circuit 337 such that the first internal data ID1 and the second internal data ID2 stored in the core circuit 337 are output when the read command RDC is generated.

The mode signal generation circuit 335 may generate the mode signal MDB from the command CA based on the mode set command MSC. The mode signal MDB may be activated to enter an operation mode for reducing power consumption of the semiconductor system 3 while the impedance matching operation is performed. When the mode set command MSC is generated, the mode signal generation circuit 335 may store information extracted from the command CA and may generate and output the mode signal MDB based on the information extracted from the command CA.

The drive control signal generation circuit 339 may generate a first drive control signal DCNT1 and a second drive control signal DCNT2 based on the first internal data ID1, the second internal data ID2, and the mode signal MDB. The drive control signal generation circuit 339 may generate the first drive control signal DCNT1 which is activated by the first internal data ID1 when the transmission data TD are driven to the first logic level while the mode signal MDB is inactivated out of the operation mode. The drive control signal generation circuit 339 may generate the second drive control signal DCNT2 which is activated by the second internal data ID2 when the transmission data TD are driven to the second logic level while the mode signal MDB is inactivated out of the operation mode. The drive control signal generation circuit 339 may generate the first drive control signal DCNT1 which is activated by the first internal data ID1 when the transmission data TD are driven to the first logic level while the mode signal MDB is activated to enter the operation mode and the reception node ndR is driven to the second logic level. The drive control signal generation circuit 339 may generate the second drive control signal DCNT2 which is activated by the second internal data ID2 when the transmission data TD are driven to the second logic level while the reception node ndR is driven to the first logic level in the operation mode. The drive control signal generation circuit 339 may inactivate the second drive control signal DCNT2 regardless of the second internal data ID2 when the transmission data TD are driven to the second logic level while the reception node ndR is driven to the second logic level in the operation mode, thereby reducing an amount of a current which is consumed to generate the second drive control signal DCNT2. The drive control signal generation circuit 339 may inactivate the first drive control signal DCNT1 regardless of the first internal data ID1 when the transmission data TD are driven to the first logic level while the reception node ndR is driven to the first logic level in the operation mode, thereby reducing an amount of a current which is consumed to generate the first drive control signal DCNT1.

The drive circuit 341 may drive the transmission data TD based on the first drive control signal DCNT1 and the second drive control signal DCNT2. The drive circuit 341 may drive the transmission data TD to the first logic level when the first drive control signal DCNT1 is activated and the second drive control signal DCNT2 is inactivated while the operation mode is inactivated. The drive circuit 341 may drive the transmission data TD to the second logic level when the first drive control signal DCNT1 is inactivated and the second drive control signal DCNT2 is activated while the operation mode is inactivated. The drive circuit 341 may receive the first drive control signal DCNT1 which is activated and the second drive control signal DCNT2 which is inactivated, thereby driving the transmission data TD to the first logic level when the transmission data TD are driven to the first logic level while the reception node ndR is driven to the second logic level in the operation mode. The drive circuit 341 may receive the first drive control signal DCNT1 which is inactivated and the second drive control signal DCNT2 which is inactivated, thereby inhibiting the transmission data TD from being driven when the transmission data TD are driven to the second logic level while the reception node ndR is driven to the second logic level in the operation mode. As a result, it may be possible to reduce power consumption of the semiconductor system 3. The drive circuit 341 may receive the first drive control signal DCNT1 which is inactivated and the second drive control signal DCNT2 which is activated, thereby driving the transmission data TD to the second logic level when the transmission data TD are driven to the second logic level while the reception node ndR is driven to the first logic level in the operation mode. The drive circuit 341 may receive the first drive control signal DCNT1 which is inactivated and the second drive control signal DCNT2 which is inactivated, thereby inhibiting the transmission data TD from being driven when the transmission data TD are driven to the first logic level while the reception node ndR is driven to the first logic level in the operation mode. As a result, it may be possible to reduce power consumption of the semiconductor system 3.

The semiconductor system 3 according to the present embodiments may provide the operation mode in which the first drive control signal DCNT1 or the second drive control signal DCNT2 is inactivated when the transmission data TD are driven by the termination circuit 313 included in the controller 310, thereby reducing an amount of a current that is consumed to generate the first drive control signal DCNT1 and the second drive control signal DCNT2. In addition, the semiconductor system 3 according to the present embodiments may provide the operation mode in which some of operations of the drive circuit 341 are inhibited when the transmission data TD are driven by the termination circuit 313 included in the controller 310, thereby reducing an amount of a current that is consumed to drive the transmission data TD.

Figure 15:
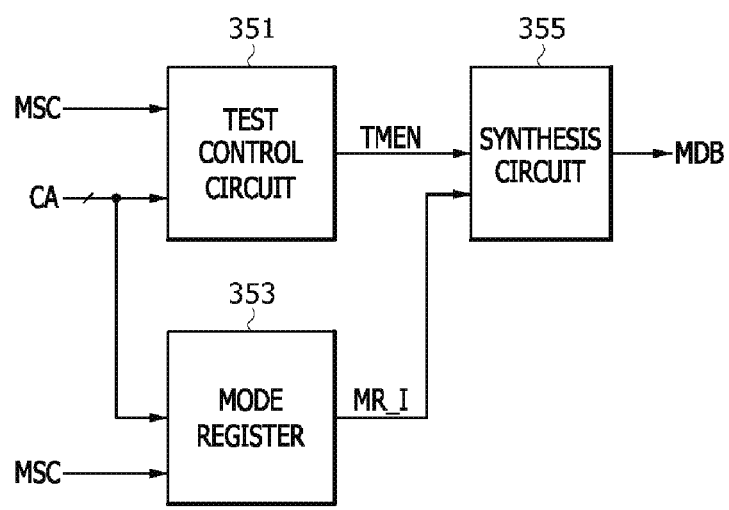
FIG. 15 is a block diagram illustrating a configuration of an example of a mode signal generation circuit included in the semiconductor system illustrated in FIG. 14.

FIG. 15 is a block diagram illustrating a configuration of an example of the mode signal generation circuit 335. As illustrated in FIG. 15, the mode signal generation circuit 335 may include a test control circuit 351, a mode register 353, and a synthesis circuit 355.

The test control circuit 351 may extract a test activation signal TMEN from the command CA when the mode set command MSC is generated. The test control circuit 351 may store the test activation signal TMEN extracted from the command CA and may output the test activation signal TMEN to the synthesis circuit 355. The test activation signal TMEN may be activated to enter a test mode.

The mode register 353 may extract a mode register information signal MR_I from the command CA when the mode set command MSC is generated. The mode register 353 may store the mode register information signal MR_I extracted from the command CA and may output the mode register information signal MR_I to the synthesis circuit 355. The mode register information signal MR_I may be activated to enter the operation mode.

The synthesis circuit 355 may synthesize the test activation signal TMEN and the mode register information signal MR_I to generate the mode signal MDB. The synthesis circuit 355 may generate the mode signal MDB which is activated when both of the test activation signal TMEN and the mode register information signal MR_I are activated. In some embodiments, the synthesis circuit 355 may generate the mode signal MDB which is activated when the test activation signal TMEN or the mode register information signal MR_I is activated.

Figure 16:
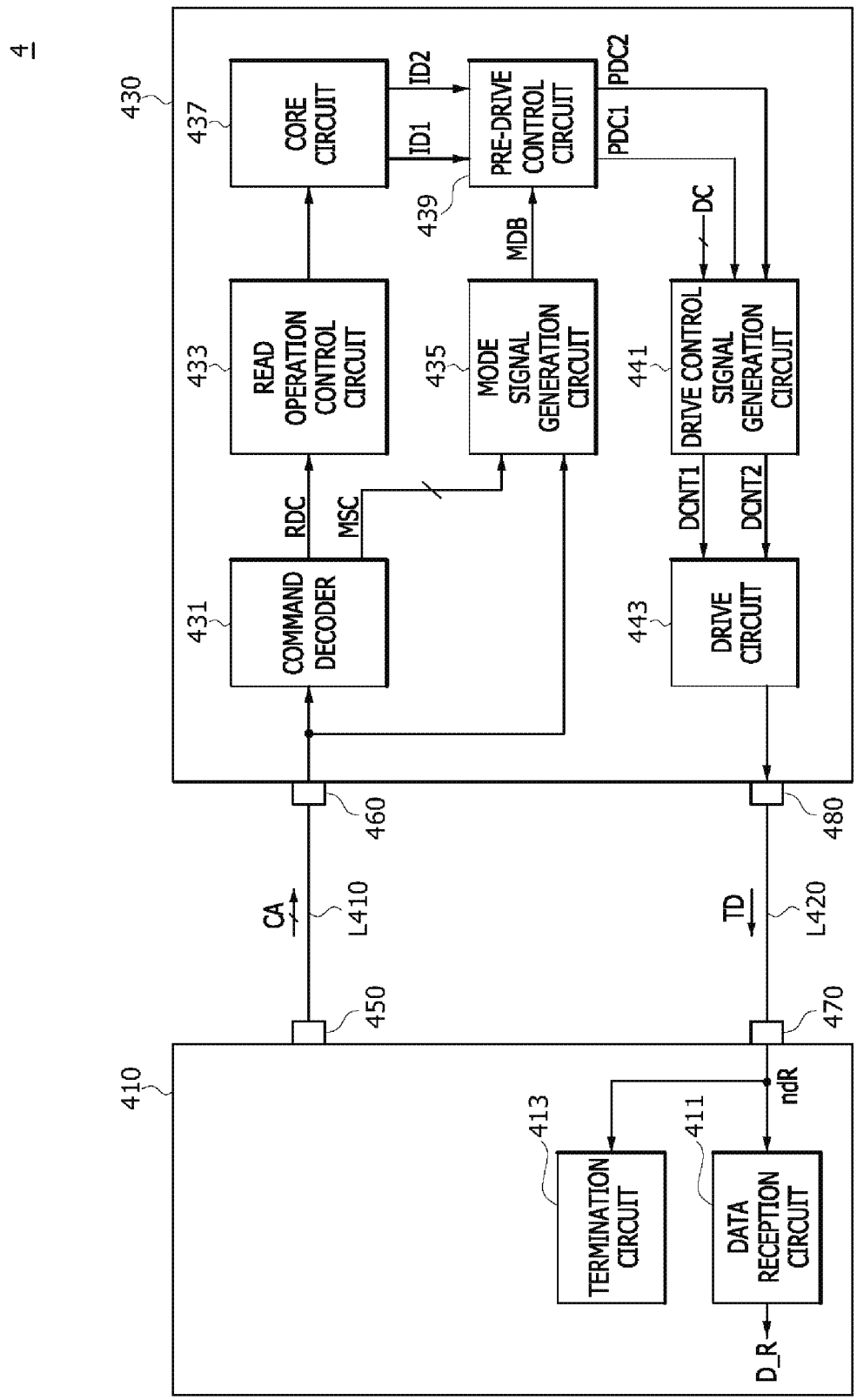
FIG. 16 is a block diagram illustrating a configuration of a semiconductor system according to another embodiment of the present disclosure.

FIG. 16 is a block diagram illustrating a configuration of a semiconductor system 4 according to another embodiment of the present disclosure. The semiconductor system 4 may include a controller 410 and a memory device 430. The controller 410 may include a data reception circuit 411 and a termination circuit 413, and the memory device 430 may include a command decoder 431, a read operation control circuit 433, a mode signal generation circuit 435, a core circuit 437, a pre-drive control circuit 439, a drive control signal generation circuit 441, and a drive circuit 443. The controller 410, the command decoder 431, the read operation control circuit 433, the mode signal generation circuit 435, the core circuit 437, and the drive circuit 443 may be realized using the same circuits as the controller 310, the command decoder 331, the read operation control circuit 333, the mode signal generation circuit 335, the core circuit 337, and the drive circuit 341, respectively. Thus, descriptions of configurations and operations of the controller 410, the command decoder 431, the read operation control circuit 433, the mode signal generation circuit 435, the core circuit 437, and the drive circuit 443 will be omitted hereinafter. In addition, configurations and operations of the pre-drive control circuit 439 and the drive control signal generation circuit 441 may be the same as the configurations and the operations of the pre-drive control circuit 201 and the drive control circuit 203 which are described with reference to FIGS. 12 and 13. Thus, descriptions of the pre-drive control circuit 439 and the drive control signal generation circuit 441 will be omitted hereinafter.

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts is not limited to the above descriptions but defined by the accompanying claims, and all of distinctive features in the equivalent scope should be construed as being included in the concepts.

What is claimed is:

1. An electronic system comprising:
a reception device including a reception node coupled to a termination circuit, the reception device configured to generate reception data from transmission data input to the reception node, and the termination circuit configured to perform an impedance matching operation; and
a transmission device configured to generate a drive control signal from internal data based on a mode signal and configured to drive the transmission data based on the drive control signal,
wherein the drive control signal is inactivated regardless of the internal data based on the mode signal.

2. The electronic system of claim 1, wherein the reception device further includes a data reception circuit configured to perform one of buffering and amplifying the transmission data based on a reference voltage to generate the reception data.

3. The electronic system of claim 1,
wherein the termination circuit includes one of a passive element and an active element for driving the reception node; and
wherein an impedance value of one of the passive element and the active element is set to be matched with an impedance value of a transmission line through which the transmission data are transmitted.

4. The electronic system of claim 3,
wherein the passive element includes a resistive element; and
wherein the active element includes a metal-oxide-silicon (MOS) transistor which is turned on based on a termination activation signal.

5. The electronic system of claim 1, wherein the termination circuit is electrically coupled between the reception node and one of a ground voltage terminal and a power supply voltage terminal.

6. The electronic system of claim 1, wherein the mode signal is activated to enter an operation mode for reducing power consumption while the impedance matching operation is performed.

7. The electronic system of claim 1,
wherein the drive control signal includes a first drive control signal and a second drive control signal; and
wherein the transmission data are driven to a first logic level when the first drive control signal is activated and are driven to a second logic level when the second drive control signal is activated.

8. The electronic system of claim 7, wherein when the termination circuit performs the impedance matching operation to drive the reception node to the first logic level, the transmission device generates the first drive control signal maintaining an inactivated state regardless of the internal data.

9. The electronic system of claim 7, wherein when the termination circuit performs the impedance matching operation to drive the reception node to the second logic level, the transmission device generates the second drive control signal maintaining an inactivated state regardless of the internal data.

10. The electronic system of claim 1,
wherein the internal data include first internal data and second internal data;
wherein the drive control signal includes a first drive control signal and a second drive control signal; and
wherein the transmission device includes:
a drive control signal generation circuit configured to generate the first drive control signal and the second drive control signal from the first internal data and the second internal data based on the mode signal; and
a drive circuit configured to drive the transmission data based on the first drive control signal and the second drive control signal.

11. The electronic system of claim 10, wherein the drive control signal generation circuit is configured to perform a NAND operation on the second internal data and the mode signal to generate a resultant signal and to perform an inversion operation on the resultant signal to generate the second drive control signal.

12. The electronic system of claim 10, wherein the drive control signal generation circuit is configured to perform a first inversion operation on the first internal data to generate a first resultant signal, perform a NAND operation on the first resultant signal with the mode signal to generate the first drive control signal, perform a second inversion operation on the second internal data to generate a second resultant signal, and perform a third inversion operation on the second resultant signal to generate the second drive control signal.

13. The electronic system of claim 1,
wherein the internal data includes first internal data and second internal data;
wherein the drive control signal includes a first drive control signal and a second drive control signal; and
wherein the transmission device includes:
a pre-drive control circuit configured to generate a first pre-drive control signal and a second pre-drive control signal from the first internal data and the second internal data based on the mode signal;
a drive control circuit configured to generate the first drive control signal and the second drive control signal from the first pre-drive control signal and the second pre-drive control signal based on a drive code; and
a drive circuit configured to drive the transmission data based on the first drive control signal and the second drive control signal.

14. The electronic system of claim 13, wherein a drivability of the drive circuit for driving the transmission data is adjusted according to a drive code.

15. An electronic system comprising:
a termination circuit connected to a reception node to which transmission data are input and configured to perform an impedance matching operation to drive the reception node;
a drive control signal generation circuit configured to generate a first drive control signal and a second drive control signal from internal data based on a mode signal; and
a drive circuit configured to drive the transmission data based on the first drive control signal and the second drive control signal,
wherein on of the first drive control signal and the second drive control signal is inactivated regardless of the internal data when the mode signal is activated.

16. The electronic system of claim 15, wherein when the termination circuit performs the impedance matching operation to drive the reception node to a first logic level, the drive control signal generation circuit generates the first drive control signal maintaining an inactivated state regardless of the internal data.

17. The electronic system of claim 15, wherein when the termination circuit performs the impedance matching operation to drive the reception node to a second logic level, the drive control signal generation circuit generates the second drive control signal maintaining an inactivated state regardless of the internal data.

18. The electronic system of claim 15,
wherein the termination circuit includes one of a passive element and an active element for driving the reception node; and
wherein an impedance value of one of the passive element and the active element is set to be matched with an impedance value of a transmission line through which the transmission data are transmitted.

19. The electronic system of claim 18,
wherein the passive element includes a resistive element; and
wherein the active element includes a metal-oxide-silicon (MOS) transistor which is turned on based on a termination activation signal.

20. The electronic system of claim 15, wherein the termination circuit is electrically coupled between the reception node and one of a ground voltage terminal and a power supply voltage terminal.

21. A semiconductor system comprising:
a controller configured to output a command, configured to receive transmission data through a reception node, and including a termination circuit, the termination circuit coupled to the reception node and configured to perform an impedance matching operation; and
a memory device configured to perform a read operation based on the command to output the transmission data, configured to generate a drive control signal from internal data based on a mode signal, and configured to drive the transmission data based on the drive control signal,
wherein the drive control signal is inactivated regardless of the internal data based on the mode signal.

22. The semiconductor system of claim 21,
wherein the drive control signal includes a first drive control signal and a second drive control signal; and
wherein when the termination circuit drives the reception node to a first logic level, the memory device generates the first drive control signal maintaining an inactivated state regardless of the internal data.

* * * * *